US012701685B2

(12) United States Patent
Park et al.

(10) Patent No.: US 12,701,685 B2
(45) Date of Patent: Aug. 4, 2026

(54) DISPLAY PANEL INCLUDING HEAT DISSIPATION STRUCTURE AND DISPLAY DEVICE INCLUDING THE SAME

(71) Applicant: Samsung Display Co., LTD., Yongin-si (KR)

(72) Inventors: Moon-Chul Park, Hwaseong-si (KR); Dokyun Kim, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 707 days.

(21) Appl. No.: 18/164,029

(22) Filed: Feb. 3, 2023

(65) Prior Publication Data

US 2023/0309280 A1 Sep. 28, 2023

(30) Foreign Application Priority Data

Mar. 24, 2022 (KR) ........................ 10-2022-0036850

(51) Int. Cl.
*H05K 7/20* (2006.01)
*H05K 9/00* (2006.01)

(52) U.S. Cl.
CPC ....... *H05K 7/20963* (2013.01); *H05K 9/0081* (2013.01)

(58) Field of Classification Search
CPC .......... H05K 7/20963; G02F 1/133305; G02F 1/13452; H10K 59/131
See application file for complete search history.

(56) References Cited

U.S. PATENT DOCUMENTS

| | | | |
|---|---|---|---|
| 10,937,850 B2 | 3/2021 | Wang et al. | |
| 2016/0174304 A1* | 6/2016 | Kim .................... | H10K 59/8792 |
| 2017/0170206 A1* | 6/2017 | Lee ..................... | H10D 86/441 |
| 2019/0019450 A1 | 1/2019 | Ahn et al. | |
| 2020/0192433 A1 | 6/2020 | Shin et al. | |
| 2021/0124197 A1* | 4/2021 | Wang ............... | G02F 1/133305 |

FOREIGN PATENT DOCUMENTS

| | | |
|---|---|---|
| KR | 20190007578 A | 1/2019 |
| KR | 20200058059 A | 5/2020 |
| KR | 20200129646 A | 11/2020 |

* cited by examiner

*Primary Examiner* — William B Partridge
*Assistant Examiner* — Mehek Ahmed
(74) *Attorney, Agent, or Firm* — CANTOR COLBURN LLP

(57) ABSTRACT

A display panel includes a display area, a pad area, and a bending area between the display area and the pad area, a lower metal layer in the display area. a semiconductor element in the display area, on the lower metal layer, and a heat dissipation layer in the pad area. The lower metal layer and the heat dissipation layer are respective patterns of a same material layer and including a same material as each other.

20 Claims, 19 Drawing Sheets

DISPLAY PANEL INCLUDING HEAT DISSIPATION STRUCTURE AND DISPLAY DEVICE INCLUDING THE SAME

This application claims priority to Korean Patent Application No. 10-2022-0036850, filed on Mar. 24, 2022, and all the benefits accruing therefrom under 35 U.S.C. § 119, which is hereby incorporated by reference for all purposes as if fully set forth herein.

BACKGROUND

1. Field

Embodiments relate generally to a display panel. More particularly, embodiments relate to a display device including the display panel.

2. Description of the Related Art

With the development of information technology, the importance of a display device, which is a connection medium between a user and information, has been highlighted. For example, the use of the display device such as a liquid crystal display device (LCD), an organic light emitting display device (OLED), a plasma display device (PDP), a quantum dot display device, or the like is increasing.

The display device may include a display panel displaying an image and a driving integrated circuit which is disposed on a lower surface of the display panel to drive the display panel. The driving integrated circuit may emit an electromagnetic wave and generate heat.

SUMMARY

An electromagnetic wave emitted by a driving integrated circuit connected to a display panel of a display device may cause electromagnetic interference (EMI) with an external device connected to the display panel. The EMI may cause a malfunction of the display device to decrease display quality. Additionally, heat generated by the driving integrated circuit may be intense at a portion of the display panel in which the driving integrated circuit is positioned according to power consumption of the driving integrated circuit. To reduce damage from the intense heat, a separate heat dissipation member or layer attached to a lower surface of the display panel may be employed, which increases costs and processes in providing the display device.

Embodiment provides a display panel with improved display quality.

Embodiment provides a display device including the display panel.

A display panel according to embodiments of the invention includes a substrate including a display area, a pad area, and a bending area between the display area and the pad area in a plan view, a lower metal layer in the display area on the substrate, a semiconductor element in the display area on the lower metal layer, and a heat dissipation layer in the pad area on the substrate and including a same material as the lower metal layer.

In an embodiment, the lower metal layer may include molybdenum (Mo).

In an embodiment, the display panel may further include a display structure and a connection pattern. The display structure may be in the display area on the semiconductor element. The connection pattern may be in the display area between the semiconductor element and the display structure, and electrically connecting the semiconductor element and the display structure.

In an embodiment, the display panel may further include an input line and a first output line. The input line may be in the pad area on the heat dissipation layer and including a same material as the connection pattern. The first output line may be in the pad area on the heat dissipation layer and including a same material as the connection pattern.

In an embodiment, the display panel may further include an inorganic insulating layer and an organic insulating layer. The inorganic insulating layer may be in the display area on the lower metal layer and extending from the display area to the pad area. The organic insulating layer may be in the display area between the inorganic insulating layer and the connection pattern, and extending from the display area to the bending area and the pad area.

In an embodiment, the input line may be connected to the heat dissipation layer through a first contact hole extended through a portion of the inorganic insulating layer and the organic insulating layer. The first output line may be connected to the heat dissipation layer through a second contact hole extended through a portion of the inorganic insulating layer and the organic insulating layer.

In an embodiment, the display panel may further include a transmission line in the bending area on the substrate and including a same material as the lower metal layer, and a second output line in the display area on the substrate and including a same material as the connection pattern.

In an embodiment, the transmission line may extend from the bending area to a portion of the display area and a portion of the pad area.

In an embodiment, the first output line may be connected to the transmission line through a third contact hole extended through a portion of the inorganic insulating layer and the organic insulating layer. The second output line may be connected to the transmission line through a fourth contact hole extended through a portion of the inorganic insulating layer and the organic insulating layer.

In an embodiment, the display panel may further include a shielding layer in the bending area on the substrate and including a same material as the connection pattern.

In an embodiment, the shielding layer may extend from the bending area to a portion of the display area and a portion of the pad area.

In an embodiment, the semiconductor element may include an inorganic semiconductor or an organic semiconductor.

A display device according to embodiments of the invention includes a display panel and a driving integrated circuit. The display panel may include a substrate including a display area, a pad area, and a bending area between the display area and the pad area in a plan view, a lower metal layer in the display area on the substrate, a semiconductor element in the display area on the lower metal layer, and a heat dissipation layer in the pad area on the substrate and including a same material as the lower metal layer. The driving integrated circuit may be in the pad area on the display panel.

In an embodiment, the lower metal layer may include molybdenum.

In an embodiment, the display panel may further include a display structure and a connection pattern. The display structure may be in the display area on the semiconductor element. The connection pattern may be in the display area between the semiconductor element and the display structure, and electrically connecting the semiconductor element and the display structure to each other.

In an embodiment, the display panel may further include an input line, a first output line, a second output line, and a transmission line. The transmission line may be in the bending area on the substrate, extending from the bending area to a portion of the display area and a portion of the pad area, and including a same material as the lower metal layer. The input line may be in the pad area on the heat dissipation layer and including a same material as the connection pattern. The first output line may be in the pad area on the heat dissipation layer and including a same material as the connection pattern. The second output line may be in the display area and on the transmission line and including a same material as the connection pattern.

In an embodiment, the display panel may further include an inorganic insulating layer and an organic insulating layer. The inorganic insulating layer may be in the display area on the lower metal layer and extending from the display area to the pad area. The organic insulating layer may be in the display area between the inorganic insulating layer and the connection pattern, and extending from the display area to the bending area and the pad area.

In an embodiment, the input line may be connected to the heat dissipation layer through a first contact hole extended through a portion of the inorganic insulating layer and the organic insulating layer. The first output line may be connected to the heat dissipation layer through a second contact hole extended through a portion of the inorganic insulating layer and the organic insulating layer. The first output line may be connected to the transmission line through a third contact hole extended through a portion of the inorganic insulating layer and the organic insulating layer. The second output line may be connected to the transmission line through a fourth contact hole extended through a portion of the inorganic insulating layer and the organic insulating layer.

In an embodiment, the display panel may further include a shielding layer in the bending area on the substrate, extending from the bending area to a portion of the display area and a portion of the pad area, and including a same material as the connection pattern.

In an embodiment, the display device may further include a connection film and a cover tape. The connection film may be on the pad area on the display panel. The cover tape may be on the pad area on the driving integrated circuit and covering the driving integrated circuit.

A display panel of a display device according to one or more embodiment of the invention may include a heat dissipation layer in a pad area, on (or in) the same layer as a lower metal layer in a display area. Accordingly, heat generated inside (e.g., a driving integrated circuit) the display device may be effectively diffused and radiated to the outside.

In addition, the display panel of the display device according to one or more embodiment may include a shielding layer in a bending area, on (or in) the same layer as a connection pattern in the display area, for electrically connecting a semiconductor element and a display structure to each other in the display area. In this case, the shielding layer may shield electromagnetic waves emitted from the driving integrated circuit in the bending area. Electromagnetic interference (EMI) caused by electromagnetic waves emitted from the driving integrated circuit and an external device may be reduced.

BRIEF DESCRIPTION OF THE DRAWINGS

Illustrative, non-limiting embodiments will be more clearly understood from the following detailed description in conjunction with the accompanying drawings.

FIGS. 7 to 19 are cross-sectional views illustrating a method of manufacturing (or providing) the display device of FIGS. 3 to 6.

DETAILED DESCRIPTION

Figure 1:
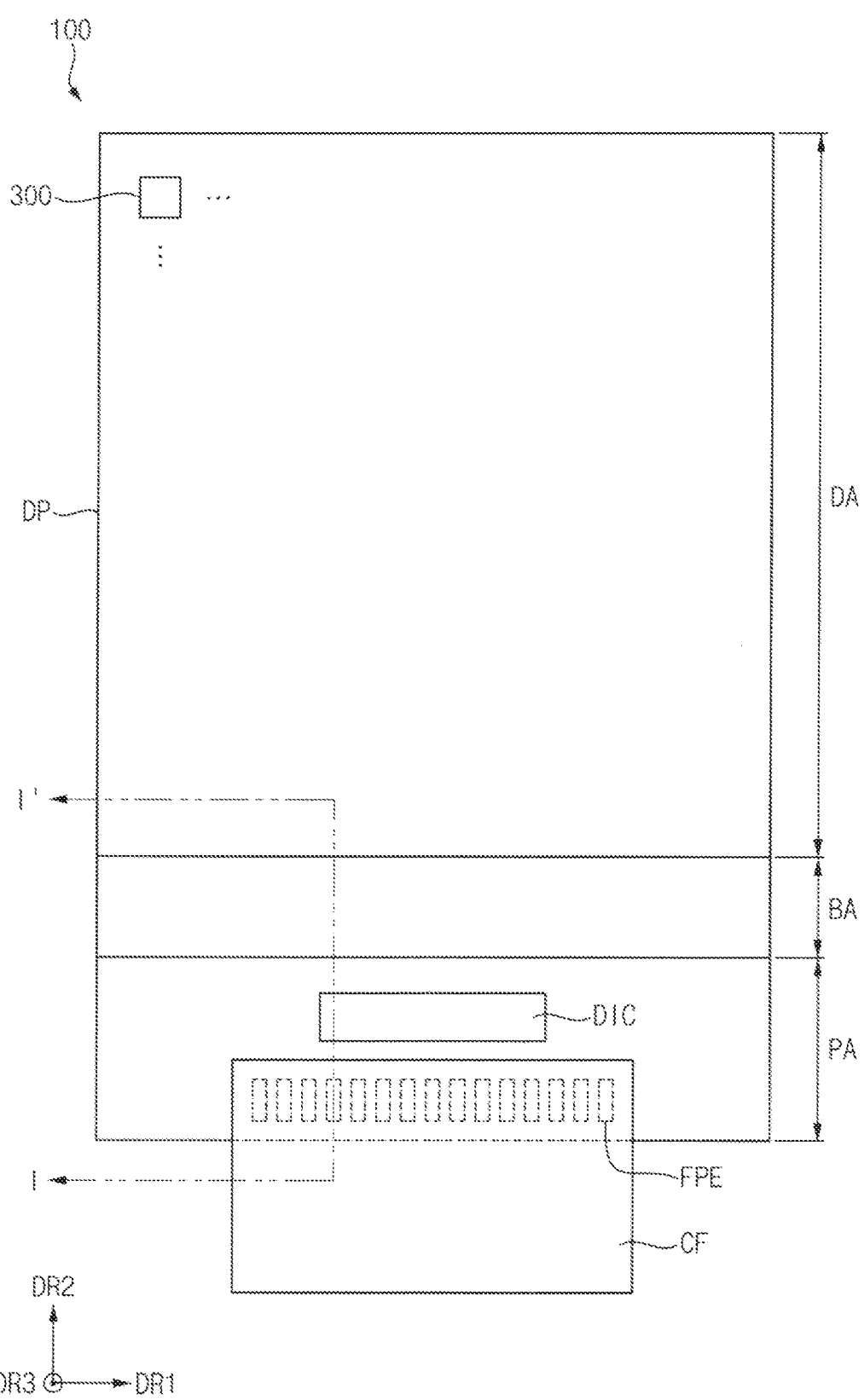
FIG. 1 is a plan view illustrating a display device according to an embodiment.

Hereinafter, embodiments of the present disclosure will be explained in detail with reference to the accompanying drawings. The same reference numerals are used for the same components in the drawings, and redundant descriptions of the same components will be omitted. As used herein, a reference number may indicate a singular element or a plurality of the element. For example, a reference number labeling a singular form of an element within the drawing figures may be used to reference a plurality of the singular element within the text of specification.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
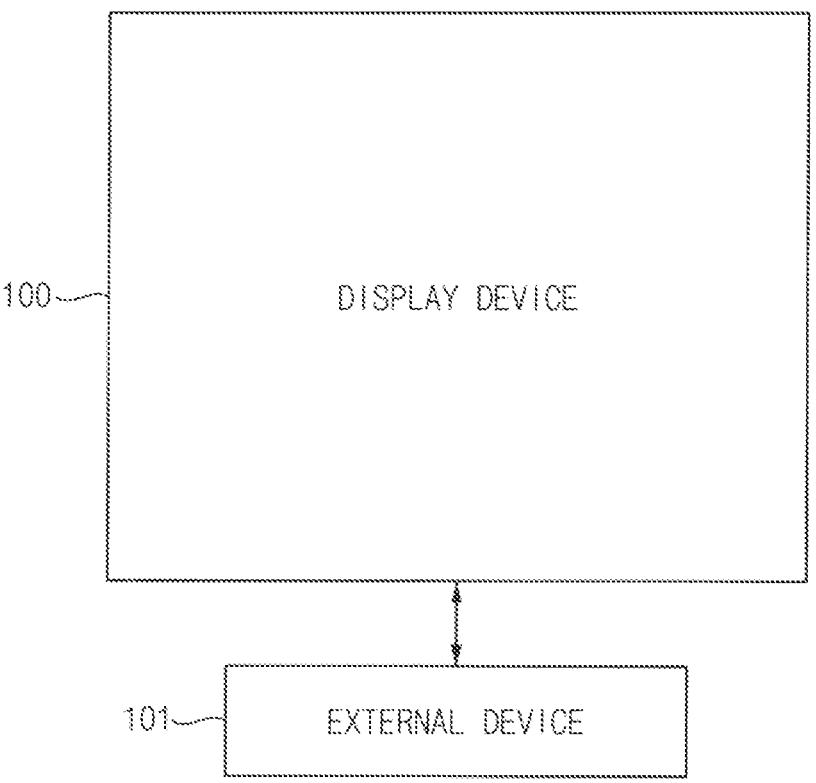
FIG. 2 is a block diagram illustrating an external device electrically connected to the display device of FIG. 1.

FIG. 1 is a plan view illustrating a display device 100 according to an embodiment. FIG. 2 is a block diagram illustrating an external device 101 electrically connected to the display device 100 of FIG. 1. For example, the display device 100 illustrated in FIG. 1 is flat or unbent (e.g., in a state where the display panel DP is flat or bent).

Referring to FIGS. 1 and 2, the display device 100 according to an embodiment may include a display panel DP, a driving integrated circuit DIC, and a connection film CF. Here, the display panel DP may include display structures 300 and a film pad electrode FPE provided in plural including a plurality of film pad electrodes FPE.

The display panel DP may be divided into a display area DA, a bending area BA at which the display panel DP is bendable, and a pad area PA. The pad area PA may be spaced apart from one side of the display area DA in a direction opposite to a second direction DR2 parallel to an upper surface of the display panel DP. That is, the display panel DP which is flat or unbent may be disposed in a plane defined by a first direction DR1 crossing the second direction DR2. The bending area BA may be positioned between the display area DA and the pad area PA in a plan view (e.g., a view along a third direction DR3 of the plane). Various components or layers of the display device 100 may include a display area DA, a bending area BA and/or a pad area PA corresponding to those described above.

As illustrated in FIG. 2, the external device 101 may be electrically connected to the display device 100, at the pad area PA. For example, the external device 101 may be electrically connected to the display device 100 through the connection film CF. The external device 101 may generate an electrical signal such as a driving signal, a driving voltage, or the like, to control the display structure 300 and display an image on the display panel DP.

The film pad electrodes FPE may be disposed in the pad area PA. The film pad electrodes FPE may be disposed to be spaced apart from each other in the first direction DR1. Here, the first direction DR1 may be a direction substantially parallel to the upper surface of the display device 100. Some of the film pad electrodes FPE may be connected to the driving integrated circuit DIC through lines (e.g., signal line, conductive lines, etc.), and the rest of the film pad electrodes FPE (e.g., a remainder of the film pad electrode FPE not connected to the driving integrated circuit DIC through the lines) may be connected to the display structures 300 through other lines. Each of the film pad electrodes FPE may include a metal, an alloy, a metal nitride, a conductive metal oxide, a transparent conductive material, and the like. These may be used alone or in combination with each other.

The connection film CF may be electrically connected to the film pad electrodes FPE at a first end of the connection film CF and may be electrically connected to the external device 101 at a second end of the connection film CF which is opposite to the first end thereof. That is, the driving signal and the driving voltage generated from the external device 101 may be provided to the driving integrated circuit DIC and the display structures 300 through the connection film CF and the film pad electrodes FPE, to display an image. For example, the connection film CF may include a flexible printed circuit board (FPCB), a printed circuit board (PCB), a flexible flat cable (FFC), or the like.

The driving integrated circuit DIC may be disposed in the pad area PA, on the display panel DP. The driving integrated circuit DIC may convert a digital data signal among the driving signals into an analog data signal and provide the converted digital data signal to the display structures 300, to drive the display panel DP and display the image. For example, the driving integrated circuit DIC may be a data driver. Alternatively, the display device 100 may further include a gate driver. In this case, the gate driver may be disposed on one side of the display area DA.

The display structures 300 may be disposed in the display area DA. Each of the display structures 300 may emit light. The display structures 300 may be arranged in the first direction DR1 and the second direction DR2, within the display area DA. Here, the second direction DR2 may be a direction substantially perpendicular to the first direction DR1, but is not limited thereto. Lines connected to the display structures 300 may be further disposed in the display area DA. For example, the lines in the display area DA may include a data signal line, a gate signal line, a power supply line, and the like.

However, although each of the display area DA, the bending area BA, and the pad area PA of the invention is illustrated as having a rectangular planar shape in FIG. 1, the invention is not limited thereto. For example, each of the display area DA, the bending area BA, and the pad area PA may have a triangular planar shape, a rhombus planar shape, a circular planar shape, a track-type planar shape, or an elliptical planar shape.

Figure 3:
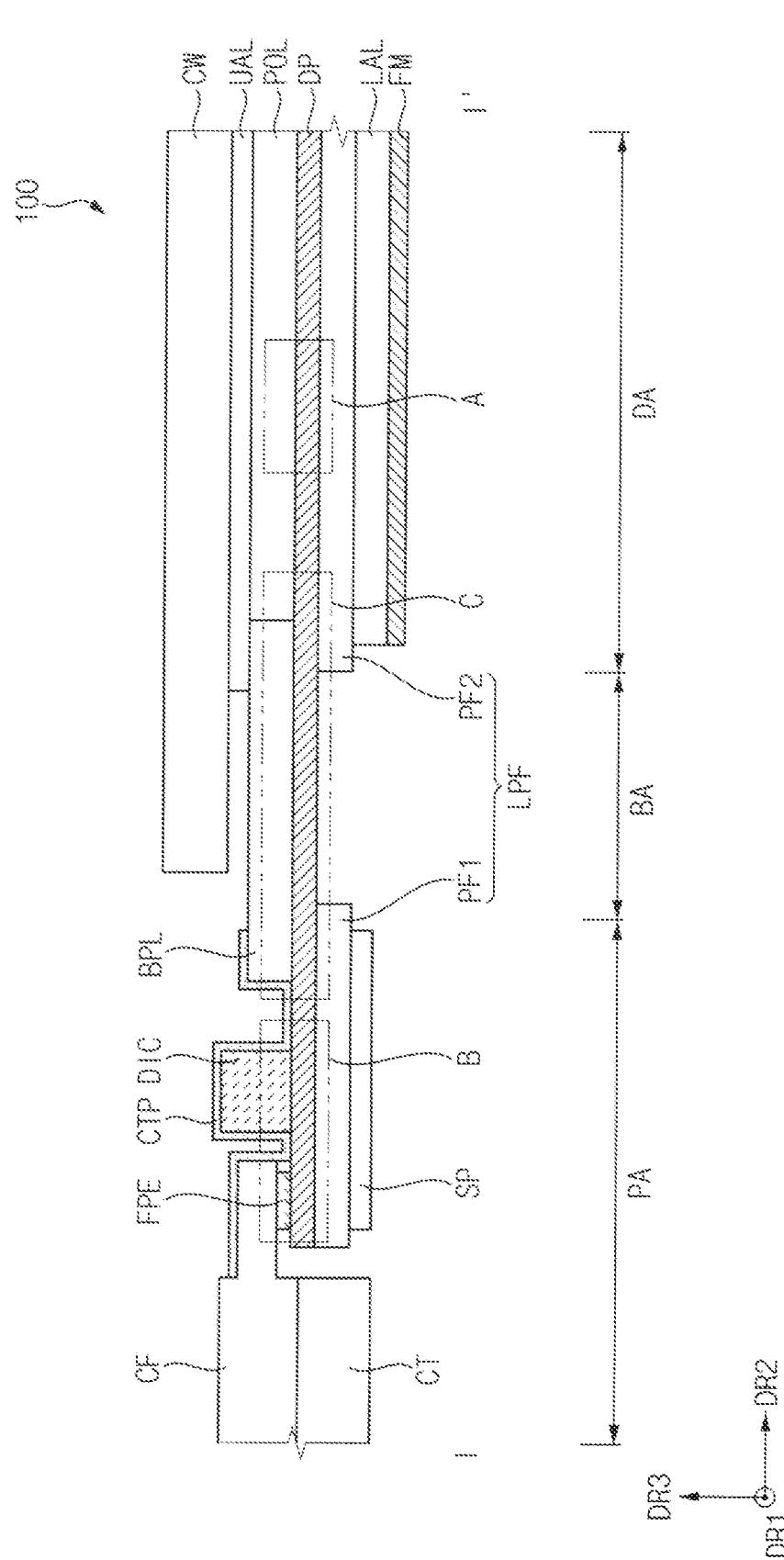
FIG. 3 is a cross-sectional view taken along line I-I' of FIG. 1.
Figure 4:
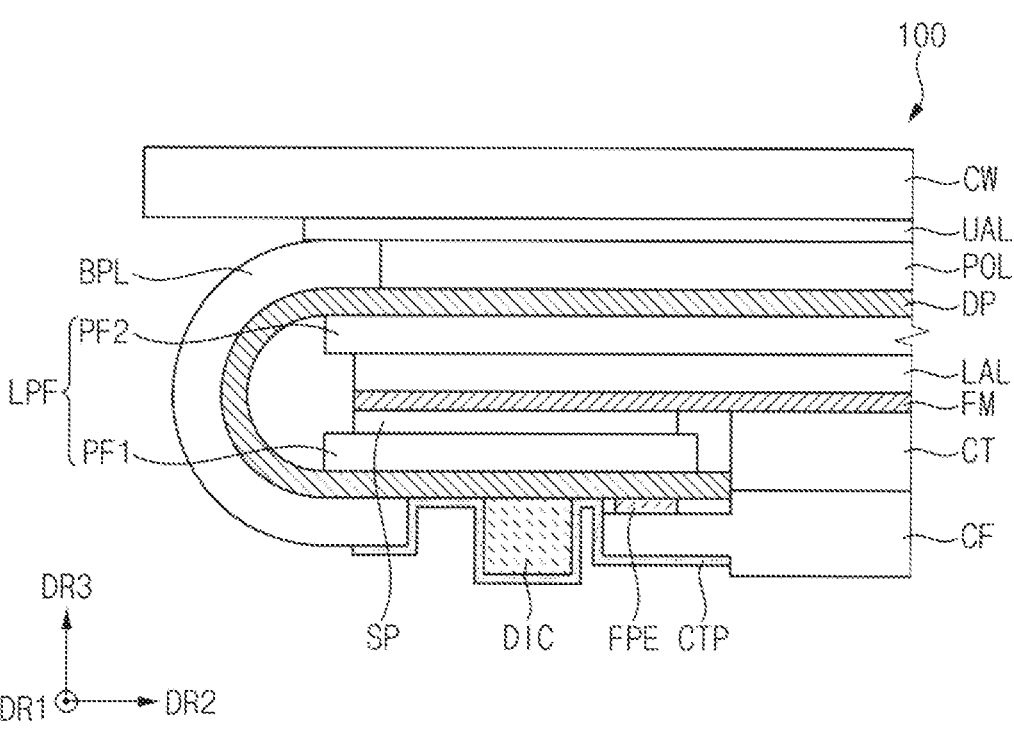
FIG. 4 is a cross-sectional view illustrating the display device of FIG. 3 which is bent.

FIG. 3 is a cross-sectional view taken along line I-I' of FIG. 1. FIG. 4 is a cross-sectional view illustrating the display device 100 of FIG. 3, which is bent. For example, the display device 100 illustrated in FIG. 3 is in a state before the display panel DP is bent (e.g., the display panel DP is flat or unbent), and the display device 100 illustrated in FIG. 4 is in a state in which the display panel DP is bent.

Various layers and/or components of the display device 100 may be bendable together with each other. Referring to FIG. 4, for example, the display device 100 may be provided in a state in which a portion of the display panel DP overlapping the bending area BA is bent. That is, the display device 100 which is bent disposes a portion of the display panel DP overlapping the bending area BA, along a thickness direction of the display device 100 (e.g., along the third direction DR3).

Referring to FIGS. 3 and 4, the display device 100 according to an embodiment of the invention may include a display panel DP, a lower protective film LPF, a lower adhesive layer LAL, a spacer SP, and a functional member FM, a polarizing member POL, a bending protective layer BPL, an upper adhesive layer UAL, a cover window CW, a driving integrated circuit DIC, a cover tape CTP, a connection film CF and a conductive tape CT. Here, the display panel DP may include the film pad electrode FPE, and the lower protective film LPF may include a first protective film PF1 and a second protective film PF2.

The lower protective film LPF may be disposed on a lower surface of the display panel DP. For example, the second protective film PF2 may be disposed on (or corresponding to) the display area DA, on the lower surface of the display panel DP, and the first protective film PF1 may be disposed on the pad area PA, on the lower surface of the display panel DP. That is, the lower protective film LPF may be disconnected at the bending area BA and may not be disposed in the bending area BA on the lower surface of the display panel DP. As being not disposed in a respective area, an element may be adjacent to and/or spaced apart from the respective area.

The lower protective film LPF may protect the lower surface of the display panel DP. For example, the lower protective film LPF may include an organic insulating material such as a photoresist, a polyacrylic resin, a polyimide-based resin, a polyamide-based resin, a siloxane-based resin, an acrylic resin, or an epoxy-based resin. Alternatively, the lower protective film LPF may include polyethylene terephthalate (PET), polyethylene naphthalene (PEN), polypropylene (PP), polycarbonate (PC), polystyrene (PS), polysulfone (PSul), polyethylene (PE), polyphthalamide (PPA), polyethersulfone (PES), polyarylat (PAR), polycarbonate oxide (PCO), modified polyphenylene oxide (MPPO), and the like. Each of these may be used alone or in combination with each other.

An adhesive member (not shown) may be disposed between the display panel DP and the lower protective film LPF. The adhesive member may adhere the lower protective film LPF to the lower surface of the display panel DP. The adhesive member may be disposed in the bending area BA.

The lower adhesive layer LAL may be disposed on the lower surface of the second protective film PF2, where the lower surface is furthest from the display panel DP. The lower adhesive layer LAL may adhere the functional member FM to the lower surface of the first protective film PF1. For example, the lower adhesive layer LAL may include an optical clear adhesive (OCA), a pressure sensitive adhesive (PSA), an optical clear resin (OCR), and the like. These may be used alone or in combination with each other.

The functional member FM may be disposed on the lower surface of the lower adhesive layer LAL. The functional member FM may include a digitizer, a heat sink, and the like. For example, the digitizer may be a device that converts coordinates of the input means into digital data when the input means such as a pen comes into contact with the cover window CW. The digitizer may operate using an electromagnetic resonance method. In addition, the heat sink may dissipate heat transferred to the lower surface of the display panel DP. The heat sink may include a material having high thermal conductivity. For example, the heat sink may include graphite. Alternatively, the heat sink may include aluminum (Al), an alloy containing aluminum, a copper (Cu), an alloy containing copper, a silver (Ag), an alloy containing silver, and the like. These may be used alone or in combination with each other. In an embodiment, when the functional member FM includes the heat sink, the heat sink may be omitted.

The spacer SP may be disposed on a lower surface of the first protective film PF1. As illustrated in FIG. 4, the spacer SP may compensate for a step difference between the first protective film PF1 and the conductive tape CT. Alternatively, the spacer SP may further include an adhesive material, and the spacer SP may be fixed to the lower surface of the functional member FM. For example, the spacer SP may include an organic insulating material. In an embodiment, the spacer SP may include PET, PEN, PP, PC, PS, PSul, PE, PPA, PES, PAR, PCO, MPPO, and the like. These may be used alone or in combination with each other.

The polarizing member POL may be disposed in the display area DA, on the display panel DP. The polarizing member POL may block external light incident to the display panel DP from the outside (e.g., from outside of the display panel DP or outside of the display device 100).

The bending protective layer BPL may be disposed on the display panel DP. The bending protective layer BPL may be disposed on a portion of the display area DA, a portion of the bending area BA, and a portion of the pad area PA. The bending protective layer BPL may raise the neutral plane of the display device 100 in the bending area BA at which there is no (or minimal) compress and tension stresses. The bending protective layer BPL may include a photocurable resin or a thermosetting resin. For example, epoxy resin, amino resin, phenol resin, urea resin, melamine resin, unsaturated polyester resin, poly, a urethane resin, a polyimide resin, and the like. These may be used alone or in combination with each other.

The upper adhesive layer UAL may be disposed on the polarizing member POL and the bending protective layer BPL. The upper adhesive layer UAL may overlap a portion of the bending protective layer BPL and the polarizing member POL. The upper adhesive layer UAL may adhere the cover window CW on the polarizing member POL and to the bending protective layer BPL. For example, the upper adhesive layer UAL may include OCA, PSA, OCR, and the like. These may be used alone or in combination with each other.

The cover window CW may be disposed on the upper adhesive layer UAL. The cover window CW may protect the polarization member POL, the bending protective layer BPL, the display panel DP, and the like. The cover window CW may include tempered glass, reinforced plastic, or the like. Alternatively, the cover window CW may be formed as a single layer or may have a structure in which a plurality of functional layers are stacked. The image displayed by the display panel DP, may be visible from outside the display device 100, through the cover window CW.

The conductive tape CT may be disposed on the lower surface of the connection film CF. As illustrated in FIG. 4, when the display panel DP is bent at the bending area BA, the conductive tape CT may compensate for the step difference between the connection film CF and a stacked structure including the display panel DP, the second protective film PF2 and the spacer SP. Alternatively, the conductive tape CT may further include an adhesive material, and the conductive tape CT may be fixed to the lower surface of the functional member FM. For example, the conductive tape CT may include an anisotropic conductive film and the like.

The cover tape CTP may be disposed in the pad area PA, on the driving integrated circuit DIC. In addition, the cover tape CTP may be disposed on a portion of the bending protective layer BPL and a portion of the connection film CF. In the pad area PA adjacent to the bending area BA, one end (e.g., a first end) of the cover tape CTP may overlap the bending protective layer BPL, and the other end (e.g., a second end opposite to the first end) of the cover tape CTP may overlap the connection film CF. That is, the cover tape CTP may cover the driving integrated circuit DIC. The cover tape CTP may shield electromagnetic waves emitted from the driving integrated circuit DIC in the pad area PA. Accordingly, an electromagnetic interference (EMI) caused by the electromagnetic wave and an external device may be reduced. For example, the cover tape CTP may include a synthetic resin such as PET. However, the invention is not limited thereto, and the cover tape CTP may include various materials capable of shielding the electromagnetic wave.

In an embodiment, the cover tape CTP may contact only a portion of the bending protective layer BPL and a portion of the connection film CF. As being in contact, elements may form an interface therebetween, without being limited thereto. That is, the cover tape CTP may not contact the display panel DP, and an empty space may be formed between the cover tape CTP and the display panel DP. That is, the cover tape CTP may be spaced apart from the display panel DP along the thickness direction, at an area between the driving integrated circuit DIC, and each of the bending protective layer BPL and the connection film CF, respectively.

Figure 5:
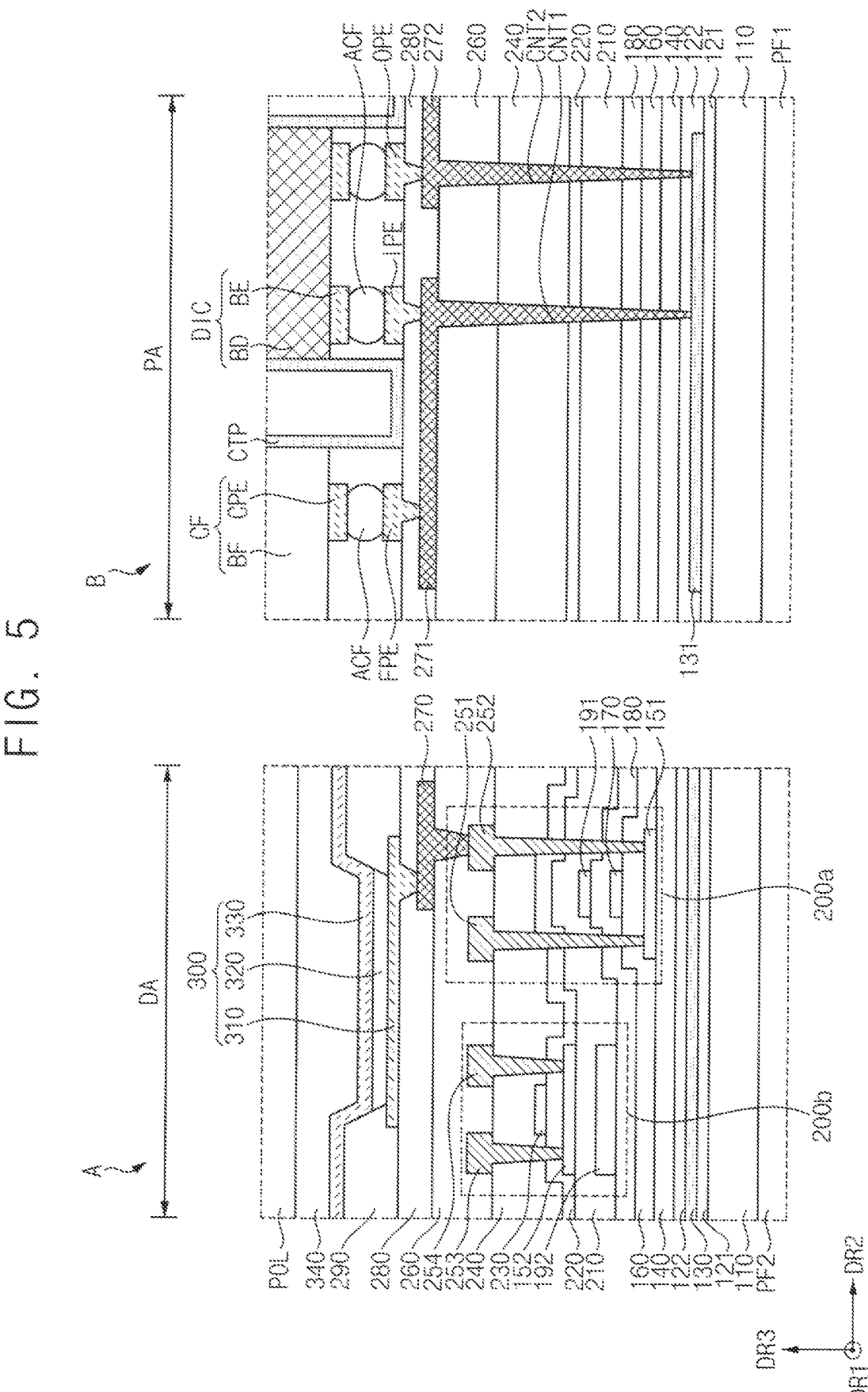
FIG. 5 is an enlarged cross-sectional view of a region A and a region B of FIG. 3.
Figure 6:
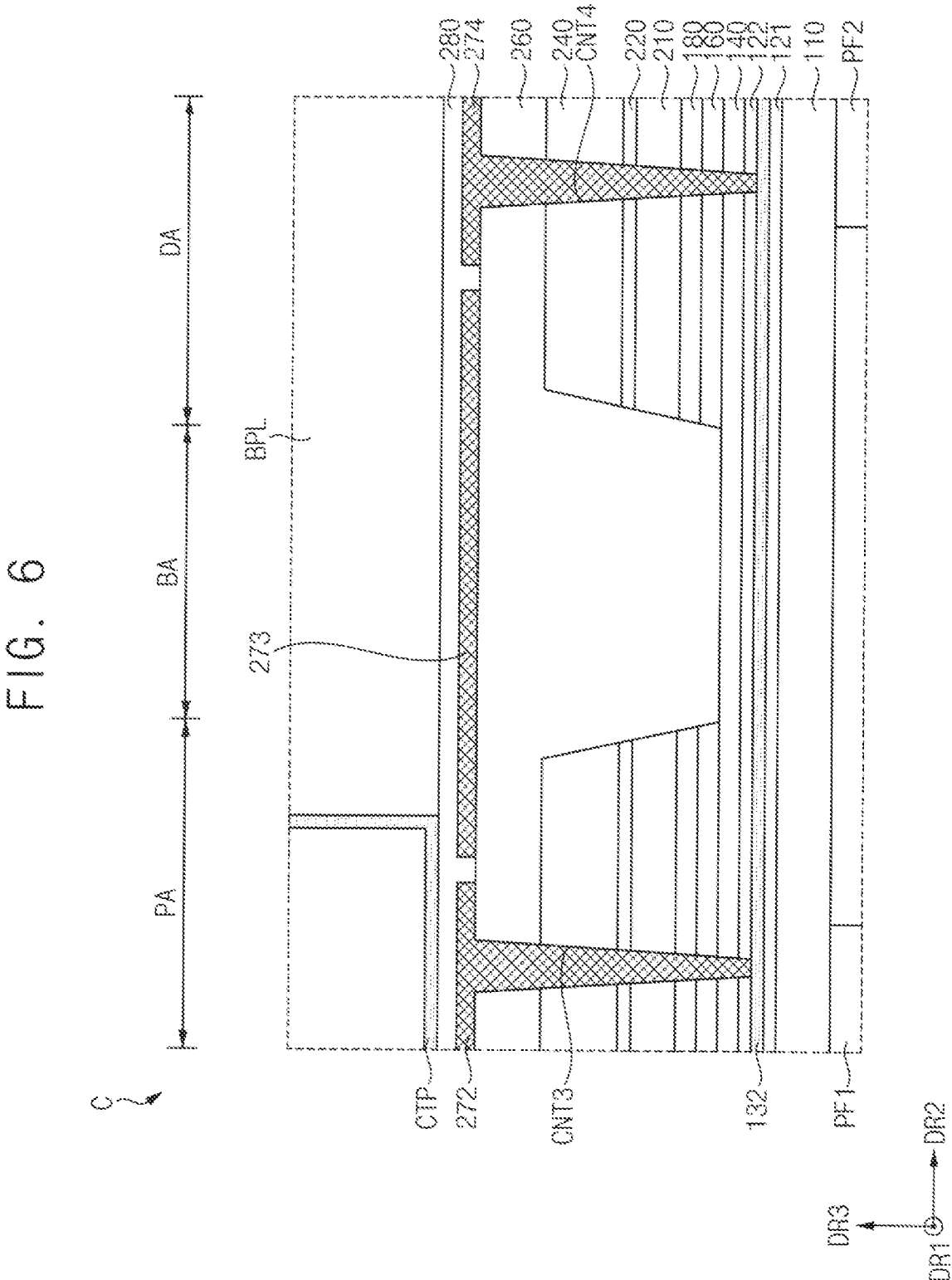
FIG. 6 is an enlarged cross-sectional view of a region C of FIG. 3.

FIG. 5 is an enlarged cross-sectional view of a region A and a region B of FIG. 3. FIG. 6 is an enlarged cross-sectional view of a region C of FIG. 3. For example, FIGS. 5 and 6 are cross-sectional views illustrating an enlarged portion of the display panel DP of FIG. 3.

Referring to FIGS. 5 and 6, the display panel DP of the display device 100 according to an embodiment of the invention may include a substrate 110, a first barrier layer 121, a lower metal layer 130, a heat dissipation layer. 131, a transmission line 132, a second barrier layer 122, a buffer layer 140, a first semiconductor element 200*a*, a first gate insulating layer 160, a second gate insulating layer 180, a first interlayer insulating layer 210, a second semiconductor element 200*b*, a third gate insulating layer 220, a second interlayer insulating layer 240, a first planarization layer 260, a connection pattern 270, an input line 271, a first output line 272, a shielding layer 273, a second output line 274, a second planarization layer 280, a pixel defining layer 290, a display structure 300, and a thin film encapsulation structure 340.

Here, the first semiconductor element 200*a* may include a first active layer 151, a first gate electrode 170, a second gate electrode 191, a first source electrode 251, and a first drain electrode 252. The second semiconductor element 200*b* may include a second active layer 152, a lower gate electrode 192, a third gate electrode 230, a second source electrode 253, and a second drain electrode 254. The display structure 300 may include a lower electrode 310, an emission layer 320, and an upper electrode 330. The display structure 300 may be considered a display element which emits light, e.g., a light emitting element.

As the display panel DP is divided into the display area DA, the bending area BA, and the pad area PA, the substrate 110 may include the display area DA, the bending area BA, and the pad area PA corresponding to those described above.

The substrate 110 may include a transparent material or an opaque material. The substrate 110 may be formed of (or include) a transparent resin substrate. An example of the transparent resin substrate that can be used as the substrate 110 may be a polyimide substrate. In this case, the polyimide substrate may include a first polyimide layer, a first barrier film layer, a second polyimide layer, a second barrier film layer, and the like. Alternatively, the substrate 110 may include a quartz substrate, a synthetic quartz substrate, a calcium fluoride substrate, a fluorine-doped quartz substrate, a sodalime glass substrate, non-alkali glass substrates, or the like.

However, although the substrate 110 has been described as having four layers, the configuration of the invention is not limited thereto. For example, in an embodiment, the substrate 110 may be composed of a single layer or a plurality of layers.

The first barrier layer 121 may be disposed in the display area DA, the bending area BA, and the pad area PA on the substrate 110. The first barrier layer 121 may include an inorganic insulating material. For example, the first barrier layer 121 may include silicon oxide, silicon nitride, silicon oxynitride, and the like. These may be used alone or in combination with each other.

The lower metal layer 130 may be disposed in the display area DA, on the first barrier layer 121. The lower metal layer 130 may block external light from reaching the first semiconductor element 200*a* and the second semiconductor element 200*b*, and function as a light blocking layer or light blocking pattern. For example, the lower metal layer 130 may include a metal, an alloy, a metal nitride, a conductive metal oxide, a transparent conductive material, and the like. These may be used alone or in combination with each other. In an embodiment, the lower metal layer 130 may include molybdenum (Mo).

In an embodiment, the heat dissipation layer 131 may be disposed in the pad area PA, on the first barrier layer 121. The heat dissipation layer 131 may be disposed on the same layer as the lower metal layer 130. That is, the heat dissipation layer 131 may include the same material as the lower metal layer 130. As being on a same layer or as including a same material, elements may be formed in a same process and/or as including a same material as each other, elements may be in a same layer as each other as respective portions of a same material layer, may be on a same layer by forming an interface with a same underlying or overlying layer, etc., without being limited thereto.

The heat dissipation layer 131 may effectively diffuse and radiate heat generated inside (e.g., the driving integrated circuit DIC) the display device 100 to the outside. For example, the heat dissipation layer 131 may include a metal, an alloy, a metal nitride, a conductive metal oxide, a transparent conductive material, and the like. These may be used alone or in combination with each other.

In an embodiment, the transmission line 132 may be disposed in the bending area BA, on the first barrier layer 121. The transmission line 132 may extend to a portion of the pad area PA and a portion of the display area DA. The transmission line 132 may electrically connect the first output line 272 and the second output line 274. The transmission line 132 may be disposed on the same layer as the lower metal layer 130. That is, the transmission line 132 may include the same material as the lower metal layer 130. For example, the transmission line 132 may include a metal, an alloy, a metal nitride, a conductive metal oxide, a transparent conductive material, and the like. These may be used alone or in combination with each other.

The second barrier layer 122 may be disposed in the display area DA, the bending area BA, and the pad area PA, on the lower metal layer 130. The second barrier layer 122 may include an inorganic insulating material. For example, the second barrier layer 122 may include silicon oxide, silicon nitride, silicon oxynitride, and the like. These may be used alone or in combination with each other.

The buffer layer 140 may be disposed in the display area DA, the bending area BA, and the pad area PA, on the second barrier layer 122. The buffer layer 140 may prevent diffusion of metal atoms or impurities from the substrate 110 to a semiconductor element (e.g., the first semiconductor element 200a and the second semiconductor element 200b). In addition, when the surface of the substrate 110 is not uniform, the buffer layer 140 may serve to improve the flatness of the surface of the substrate 110. The buffer layer 140 may include an inorganic insulating material. For example, the buffer layer 140 may include a silicon compound, a metal oxide, and the like. In an embodiment, the buffer layer 140 may be omitted.

The first active layer 151 may be disposed in the display area DA, on the buffer layer 140. The first active layer 151 may include a metal oxide semiconductor, an inorganic semiconductor (e.g., amorphous silicon, polysilicon), or an organic semiconductor. In an embodiment, the first active layer 151 may include polysilicon. In addition, the first active layer 151 may have a first source region, a first drain region, and a first channel region positioned between the first source region and the first drain region.

The first gate insulating layer 160 may be disposed in the display area DA and the pad area PA, on the buffer layer 140 and the first active layer 151. The first gate insulating layer 160 may cover the first active layer 151 in the display area DA. In addition, the first gate insulating layer 160 may have or define an opening OP exposing an upper surface of the buffer layer 140 positioned in the bending area BA to outside the first gate insulating layer 160. For example, the first gate insulating layer 160 may cover the first active layer 151 on the buffer layer 140 and may be disposed along a profile of the first active layer 151 with a uniform thickness. Alternatively, the first gate insulating layer 160 may sufficiently cover the first active layer 151 on the buffer layer 140, and may have a substantially flat upper surface without creating a step difference around the first active layer 151.

The first gate insulating layer 160 may include a silicon compound, a metal oxide, and the like. For example, the first gate insulating layer 160 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. These may be used alone or in combination with each other.

The first gate electrode 170 may be disposed in the display area DA, on the first gate insulating layer 160. The first gate electrode 170 may overlap (or correspond to) the first channel region of the first active layer 151. For example, the first gate electrode 170 may include a metal, an alloy, a metal nitride, a conductive metal oxide, a transparent conductive material, and the like. These may be used alone or in combination with each other.

The second gate insulating layer 180 may be disposed in the display area DA and the pad area PA, on the first gate insulating layer 160 and the first gate electrode 170. The second gate insulating layer 180 may cover the first gate electrode 170 in the display area DA. In addition, the second gate insulating layer 180 may have an opening OP exposing the upper surface of the buffer layer 140 positioned in the bending area BA, to outside the second gate insulating layer 180. For example, the second gate insulating layer 180 may cover the first gate electrode 170 on the first gate insulating layer 160 and be disposed along the profile of the first gate electrode 170 with a uniform thickness. Alternatively, the second gate insulating layer 180 may sufficiently cover the first gate electrode 170 on the first gate insulating layer 160, and may have a substantially flat upper surface without creating a step around the first gate electrode 170. For example, the second gate insulating layer 180 may include a silicon compound, a metal oxide, and the like.

The second gate electrode 191 may be disposed in the display area DA, on the second gate insulating layer 180. The second gate electrode 191 may overlap the first gate electrode 170. The second gate electrode 191 may function as a storage capacitor together with the first gate electrode 170. For example, the second gate electrode 191 may include a metal, an alloy, a metal nitride, a conductive metal oxide, a transparent conductive material, and the like. These may be used alone or in combination with each other.

The lower gate electrode 192 may be disposed in the display area DA, on the second gate insulating layer 180. The lower gate electrode 192 may be disposed on the same layer as the second gate electrode 191 and may include the same material. The lower gate electrode 192 may function as a back gate of the second semiconductor element 200b. In addition, the lower gate electrode 192 may function as a light blocking layer that blocks external light from penetrating into the second active layer 152. For example, the lower gate electrode 192 may include a metal, an alloy, a metal nitride, a conductive metal oxide, a transparent conductive material, and the like. These may be used alone or in combination with each other.

The first interlayer insulating layer 210 may be disposed in the display area DA and the pad area PA, on the second gate insulating layer 180, the second gate electrode 191, and the lower gate electrode 192. The first interlayer insulating layer 210 may cover the second gate electrode 191 and the lower gate electrode 192 in the display area DA. In addition, the first interlayer insulating layer 210 may have an opening OP exposing the upper surface of the buffer layer 140 positioned in the bending area BA to outside the first interlayer insulating layer 210. For example, the first interlayer insulating layer 210 may cover the lower gate electrode 192 and the second gate electrode 191 on the second gate insulating layer 180, and may be disposed along profiles of the lower gate electrode 192 and the second gate electrode 191 with a uniform thickness. Alternatively, the first interlayer insulating layer 210 may sufficiently cover the lower gate electrode 192 and the second gate electrode 191 on the second gate insulating layer 180, and may have a substantially flat upper surface without creating a step difference around the lower gate electrode 192 and the second gate electrode 191. For example, the first interlayer insulating layer 210 may include a silicon compound, a metal oxide, and the like.

The second active layer 152 may be disposed in the display area DA, on the first interlayer insulating layer 210. The second active layer 152 may overlap the lower gate electrode 192. In an embodiment, the second active layer 152 may include a metal oxide semiconductor. For example, the second active layer 152 may include a metal oxide semiconductor including a binary compound ($AB_x$), a ternary compound ($AB_xC_y$), a quaternary compound ($AB_xC_yD_z$), and the like containing indium (In), zinc (Zn), gallium (Ga), tin (Sn), titanium (Ti), aluminum (Al), hafnium (Hf), and zirconium (Zr), magnesium (Mg), and the like. For example, the second active layer 152 may include zinc oxide ($ZnO_x$), gallium oxide ($GaO_x$), titanium oxide ($TiO_x$), tin oxide ($SnO_x$), indium oxide ($InO_x$), indium-gallium oxide (IGO), Indium-zinc oxide (IZO), indium-tin oxide (ITO), gallium-zinc oxide (GZO), zinc-magnesium oxide (ZMO), zinc-tin oxide (ZTO), zinc-zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), and the like. These may be used alone or in combination with each other. The second active layer 152 may include a second source region, a second drain region, and a second channel region positioned between the second source region and the second drain region.

The third gate insulating layer 220 may be disposed in the display area DA and the pad area PA, on the first interlayer insulating layer 210 and the second active layer 152. The third gate insulating layer 220 may cover the second active layer 152 in the display area DA. In addition, the third gate insulating layer 220 may have an opening OP exposing the upper surface of the buffer layer 140 positioned in the bending area BA to outside the third gate insulating layer 220. For example, the third gate insulating layer 220 may cover the second active layer 152 on the first interlayer insulating layer 210 and be disposed along the profile of the second active layer 152 with a uniform thickness. Alternatively, the third gate insulating layer 220 may sufficiently cover the second active layer 152 on the first interlayer insulating layer 210, and may have a substantially a flat upper surface without creating a step difference around the second active layer 152. For example, the third gate insulating layer 220 may include a silicon compound, a metal oxide, and the like.

The third gate electrode 230 may be disposed in the display area DA, on the third gate insulating layer 220. The third gate electrode 230 may overlap the second channel region of the second active layer 152. For example, the third gate electrode 230 may include a metal, an alloy, a metal nitride, a conductive metal oxide, a transparent conductive material, and the like. These may be used alone or in combination with each other.

The second interlayer insulating layer 240 may be disposed in the display area DA and the pad area PA, on the third gate insulating layer 220 and the third gate electrode 230. The second interlayer insulating layer 240 may sufficiently cover the third gate electrode 230. In addition, the second interlayer insulating layer 240 may have an opening OP exposing the upper surface of the buffer layer 140 positioned in the bending area BA to outside the second interlayer insulating layer 240. For example, the second interlayer insulating layer 240 may include a silicon compound, a metal oxide, and the like.

The first source electrode 251 and the first drain electrode 252 may be disposed in the display area DA, on the second interlayer insulating layer 240. The first source electrode 251 may be connected to the first source region of the first active layer 151 through (or at) a contact hole formed (or provided) by removing a first portion of an inorganic insulating layer (e.g., the first gate insulating layer 160, the second gate insulating layer 180, the first interlayer insulating layer 210, the third gate insulating layer 220, and the second interlayer insulating layer 240). The first drain electrode 252 may be connected to the first drain region of the first active layer 151 through a contact hole formed by removing a second portion of the inorganic insulating layer (e.g., the first gate insulating layer 160, the second gate insulating layer 180, the first interlayer insulating layer 210, the third gate insulating layer 220, and the second interlayer insulating layer 240). That is, the contact hole may be extended through the inorganic insulating layer.

The second source electrode 253 and the second drain electrode 254 may be disposed in the display area DA, on the second interlayer insulating layer 240. The second source electrode 253 may be connected to the second source region of the second active layer 152 through a contact hole formed by removing a third portion of an inorganic insulating layer (e.g., the third gate insulating layer 220 and the second interlayer insulating layer 240). The second drain electrode 254 may be connected to the second drain region of the second active layer 152 through a contact hole formed by removing a fourth portion of the inorganic insulating layer (e.g., the third gate insulating layer 220 and the second interlayer insulating layer 240).

For example, each of the first source electrode 251, the first drain electrode 252, the second source electrode 253, and the second drain electrode 254 may include a metal, an alloy, a metal nitride, a conductive metal oxide, a transparent conductive material, and the like. These may be used alone or in combination with each other.

Accordingly, the first semiconductor element 200a including the first active layer 151, the first gate electrode 170, the second gate electrode 191, the first source electrode 251 and the first drain electrode 252 may be disposed in the display area DA, on the substrate 110. The second semiconductor element 200b including the second active layer 152, the lower gate electrode 192, the third gate electrode 230, the second source electrode 253 and the second drain electrode 254 may be disposed in the display area DA, on the substrate 110.

The first planarization layer 260 may be disposed in the display area DA, the bending area BA, and the pad area PA, on the second interlayer insulating layer 240. The first planarization layer 260 may sufficiently cover the first source electrode 251, the first drain electrode 252, the second source electrode 253, and the second drain electrode 254. In addition, the first planarization layer 260 may fill the opening OP of each of the first gate insulating layer 160, the second gate insulating layer 180, the first interlayer insulating layer 210, the third gate insulating layer 220, and the second interlayer insulating layer 240 in the bending area BA. The first planarization layer 260 may include an organic insulating material or an inorganic insulating material. For example, the first planarization layer 260 may include an organic insulating material such as a photoresist, a poly-acryl-based resin, a polyimide-based resin, a polyamide-based resin, a siloxane-based resin, an acryl-based resin, an epoxy-based resin, and the like. These may be used alone or in combination with each other. The first planarization layer 260 may be referred to as an organic insulating layer.

The connection pattern 270 may be disposed in the display area DA, on the first planarization layer 260. The connection pattern 270 may be connected to the first drain electrode 252 through a contact hole formed by removing a portion of the first planarization layer 260. Accordingly, the connection pattern 270 may electrically connect the first drain electrode 252 and the lower electrode 310. That is, the connection pattern 270 may electrically connect the first semiconductor element 200a and the display structure 300 to each other. For example, the connection pattern 270 may include a metal, an alloy, a metal nitride, a conductive metal oxide, a transparent conductive material, and the like. These may be used alone or in combination with each other.

The input line 271 may be disposed in the pad area PA, on the first planarization layer 260. The input line 271 may be disposed on the same layer as the connection pattern 270. That is, the input line 271 may include the same material as the connection pattern 270. The input line 271 may be connected to the heat dissipation layer 131 through a first contact hole CNT1 formed by removing a portion of the inorganic insulating layer (e.g., the second barrier layer 122, the buffer layer 140, the first gate insulating layer 160, the second gate insulating layer 180, the first interlayer insulating layer 210, the third gate insulating layer 220, and the second interlayer insulating layer 240) and the first planarization layer 260. For example, the input line 271 may include a metal, an alloy, a metal nitride, a conductive metal oxide, a transparent conductive material, and the like. These may be used alone or in combination with each other.

The first output line 272 may be disposed in the pad area PA, on the first planarization layer 260. The first output line 272 may be disposed on the same layer as the connection pattern 270. That is, the first output line 272 may include the same material as the connection pattern 270.

The first output line 272 may be connected to the heat dissipation layer 131 through a second contact hole CNT2 formed by removing portions of the inorganic insulating layer (e.g., the second barrier layer 122, the buffer layer 140, the first gate insulating layer 160, the second gate insulating layer 180, the first interlayer insulating layer 210, the third gate insulating layer 220, and the second interlayer insulating layer 240) and the first planarization layer 260. In addition, the first output line 272 may be connected to the transmission line 132 through a third contact hole CNT3 formed by removing a portion of the inorganic insulating layer (e.g., the second barrier layer 122, the buffer layer 140, the first gate insulating layer 160, the second gate insulating layer 180, the first interlayer insulating layer 210, the third gate insulating layer 220, and the second interlayer insulating layer 240) and the first planarization layer 260. For example, the first output line 272 may include a metal, an alloy, a metal nitride, a conductive metal oxide, a transparent conductive material, and the like. These may be used alone or in combination with each other.

The second output line 274 may be disposed in the display area DA, on the first planarization layer 260. The second output line 274 may be disposed on the same layer as the connection pattern 270. That is, the second output line 274 may include the same material as the connection pattern 270.

The second output line 274 may be connected to the transmission line 132 through a fourth contact hole CNT4 formed by removing a portion of the inorganic insulating layer (e.g., the second barrier layer 122, the buffer layer 140, the first gate insulating layer 160, the second gate insulating layer 180, the first interlayer insulating layer 210, the third gate insulating layer 220, and the second interlayer insulating layer 240) and the first planarization layer 260. For example, the second output line 274 may include a metal, an alloy, a metal nitride, a conductive metal oxide, a transparent conductive material, and the like. These may be used alone or in combination with each other.

Accordingly, the transmission line 132 which extends across the bending area BA, may electrically connect the first output line 272 in the pad area PA and the second output line 274 in the display area DA, to each other.

In an embodiment, the shielding layer 273 may be disposed in the bending area BA, on the first planarization layer 260. The shielding layer 273 may extend from the bending area BA, to a portion of the display area DA and a portion of the pad area PA. In addition, the shielding layer 273 may be connected to the cover tape CTP through a pad (not shown).

The shielding layer 273 may be disposed on the same layer as the connection pattern 270. That is, the shielding layer 273 may include the same material as the connection pattern 270, may be respective patterns of a same material layer (e.g., a second material layer which is different from the first material layer), etc. The shielding layer 273 may shield electromagnetic waves emitted from the driving integrated circuit DIC in the bending area BA. Accordingly, the electromagnetic interference caused by the electromagnetic waves and the external device 101 may be reduced. For example, the shielding layer 273 may include a metal, an alloy, a metal nitride, a conductive metal oxide, a transparent conductive material, and the like. These may be used alone or in combination with each other.

The input line 271, the first output line 272, the shielding layer 273, and the second output line 274 are disposed on the same layer as the connection pattern 270 will be described with reference to FIGS. 5 and 6. However, the invention is not limited thereto. In an embodiment, the input line 271, the first output line 272, the shielding layer 273, and the second output line 274 may include the same material as the first gate electrode 170 or the second gate electrode 191 and may be disposed on the same layer as the first gate electrode 170 or the second gate electrode 191.

The second planarization layer 280 may be disposed in the display area DA, the bending area BA, and the pad area PA, on the first planarization layer 260. The second planarization layer 280 may sufficiently cover the connection pattern 270, the input line 271, and the first output line 272. For example, the second planarization layer 280 may include an organic insulating material or an inorganic insulating material. In an embodiment, the second planarization layer 280 may include an organic insulating material. The second planarization layer 280 may be referred to as an organic insulating layer.

The lower electrode 310 may be disposed in the display area DA, on the second planarization layer 280. The lower electrode 310 may be connected to the connection pattern 270 through a contact hole formed by removing a portion of the second planarization layer 280, and the lower electrode 310 may electrically connected to the first semiconductor element 200a. The lower electrode 310 may include a metal, an alloy, a metal nitride, a conductive metal oxide, a transparent conductive material, and the like. These may be used alone or in combination with each other.

The film pad electrode FPE, an input pad electrode IPE, and an output pad electrode OPE may be disposed in the pad area PA, on the second planarization layer 280. The display panel DP may be considered as including the film pad electrode FPE, the input pad electrode IPE, and the output pad electrode OPE, without being limited thereto. Each of the film pad electrode FPE and the input pad electrode IPE may be connected to the input line 271 through a contact hole formed by removing a portion of the second planarization layer 280. The output pad electrode OPE may be connected to the first output line 272 through a contact hole formed by removing a portion of the second planarization layer 280. For example, each of the film pad electrode FPE, the input pad electrode IPE, and the output pad electrode OPE may include a metal, an alloy, a metal nitride, a conductive metal oxide, a transparent conductive material, and the like. These may be used alone or in combination with each other.

The pixel defining layer 290 may be disposed in the display area DA, on the second planarization layer 280, and may expose a portion of an upper surface of the lower electrode 310 to outside the pixel defining layer 290. In other words, the pixel defining layer 290 may cover both of opposing sides of the lower electrode 310. The pixel defining layer 290 may include an organic insulating material or an inorganic insulating material. In an embodiment, the pixel defining layer 290 may include an organic insulating material.

The emission layer 320 as a light emitting layer may be disposed in the display area DA, on the lower electrode 310. In other words, the emission layer 320 may be disposed on the lower electrode 310 exposed by the pixel defining layer 290. The emission layer 320 may be formed (or provided) using at least one of light emitting materials capable of emitting different color lights (e.g., red light, green light, blue light, or the like) according to the type of sub-pixel. Alternatively, the emission layer 320 may emit white light as a whole by stacking a plurality of light emitting materials capable of generating different color lights such as red light, green light, and blue light.

The upper electrode 330 may be disposed in the display area DA, on the pixel defining layer 290 and the emission layer 320. For example, the upper electrode 330 may include a metal, a metal alloy, a metal nitride, a conductive metal oxide, a transparent conductive material, and the like. These may be used alone or in combination with each other.

Accordingly, the display structure 300 as a light emitting element including the lower electrode 310, the emission layer 320, and the upper electrode 330 may be disposed in the display area DA, on the substrate 110.

The thin film encapsulation structure 340 (e.g., encapsulation layer) may be disposed in the display area DA on the upper electrode 330. The thin film encapsulation structure 340 may prevent impurities, moisture, and the like from penetrating into the display structure 300 from the outside. The thin film encapsulation structure 340 may include at least one inorganic encapsulation layer and at least one organic encapsulation layer. For example, the inorganic encapsulation layer may include silicon oxide, silicon nitride, silicon oxynitride, and the like. The organic encapsulation layer may include a cured polymer such as polyacrylate.

The connection film CF may be disposed in the pad area PA, on the film pad electrode FPE. The connection film CF may include a base film BF and a connection pad electrode CPE which is disposed on a lower surface of the base film BF which is closest to the display panel DP. For example, the base film BF may include polyimide and the like. The connection pad electrode CPE may include a metal, a metal alloy, a metal nitride, a conductive metal oxide, a transparent conductive material, and the like. These may be used alone or in combination with each other.

The connection film CF may be attached to the film pad electrode FPE through an anisotropic conductive film ACF. Specifically, the connection pad electrode CPE of the connection film CF may be attached to the film pad electrode FPE through the anisotropic conductive film ACF. Accordingly, the connection film CF may be electrically connected to the display panel DP, at the film pad electrode FPE. For example, the connection film CF may provide a driving signal generated from an external device (e.g., the external device 101 of FIG. 2) to the driving integrated circuit DIC, through the input line 271 and the input pad electrode IPE.

The driving integrated circuit DIC may be disposed in the pad area PA, on the input pad electrode IPE and the output pad electrode OPE. The driving integrated circuit DIC may include a body portion BD and bump electrodes BE which are disposed on a lower surface of the body portion BD. For example, each of the bump electrodes BE may include a metal, a metal alloy, a metal nitride, a conductive metal oxide, a transparent conductive material, and the like. These may be used alone or in combination with each other.

The driving integrated circuit DIC may be attached to the input pad electrode IPE and the output pad electrode OPE through the anisotropic conductive film ACF. Specifically, each of the bump electrodes BE of the driving integrated circuit DIC may be attached to the input pad electrode IPE and the output pad electrode OPE of a display stacked structure, through the anisotropic conductive film ACF. The display stacked structure may include the film pad electrode FPE, the input pad electrode IPE, and the output pad electrode OPE together with underlying layers of the display panel DP.

Accordingly, the driving integrated circuit DIC may be electrically connected to the display panel DP. For example, the driving integrated circuit DIC may provide the driving signal to the display structure 300 through the output pad electrode OPE, the first output line 272, the transmission line 132, and the second output line 274. The second output line 274 may be connected to the display structure 300. In an embodiment, the second output line 274 may be connected to the connection pattern 270.

The display panel DP of the display device 100 according to an embodiment of the invention may include the heat dissipation layer 131 disposed on the pad area PA on the substrate 110 and disposed on the same layer (or in the same layer) as the lower metal layer 130 disposed in the display area. Accordingly, heat generated in the inside (e.g., from the driving integrated circuit DIC) of the display device 100 may be effectively diffused and discharged to the outside.

In addition, the display panel DP of the display device 100 according to an embodiment may include the shielding layer 273 disposed in the bending area BA on the substrate 110 and disposed on the same layer (or in the same layer) as the connection pattern 270 that electrically connects a semiconductor pattern (e.g., the semiconductor element 200a) and the display structure 300 disposed in the display area DA. In this case, the shielding layer 273 may shield electromagnetic waves emitted from the driving integrated circuit DIC in the bending area BA. Accordingly, the electromagnetic interference caused by the electromagnetic waves emitted from the driving integrated circuit DIC and the external device 101 may be reduced.

FIGS. 7 to 19 are cross-sectional views illustrating a method of manufacturing (or providing) the display device 100 of FIGS. 3 to 6.

Figure 7:
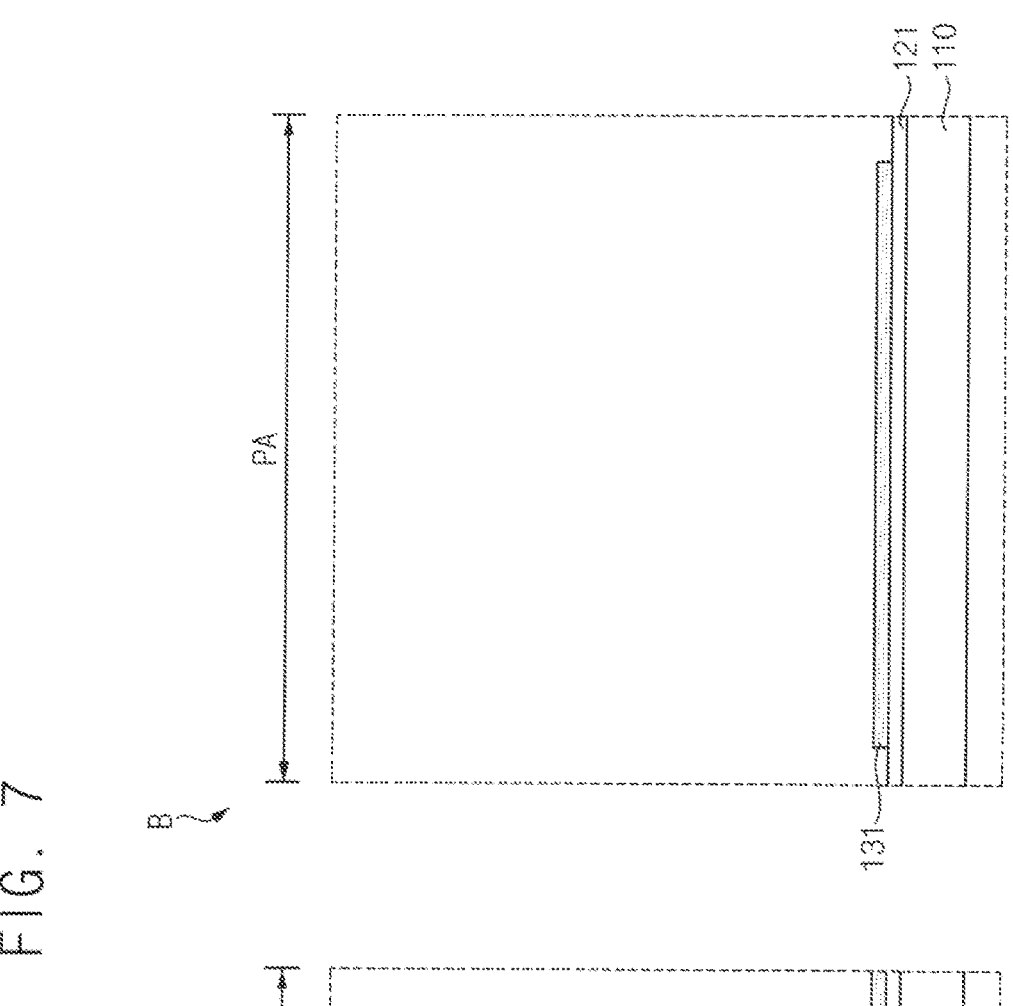
Figure 7:
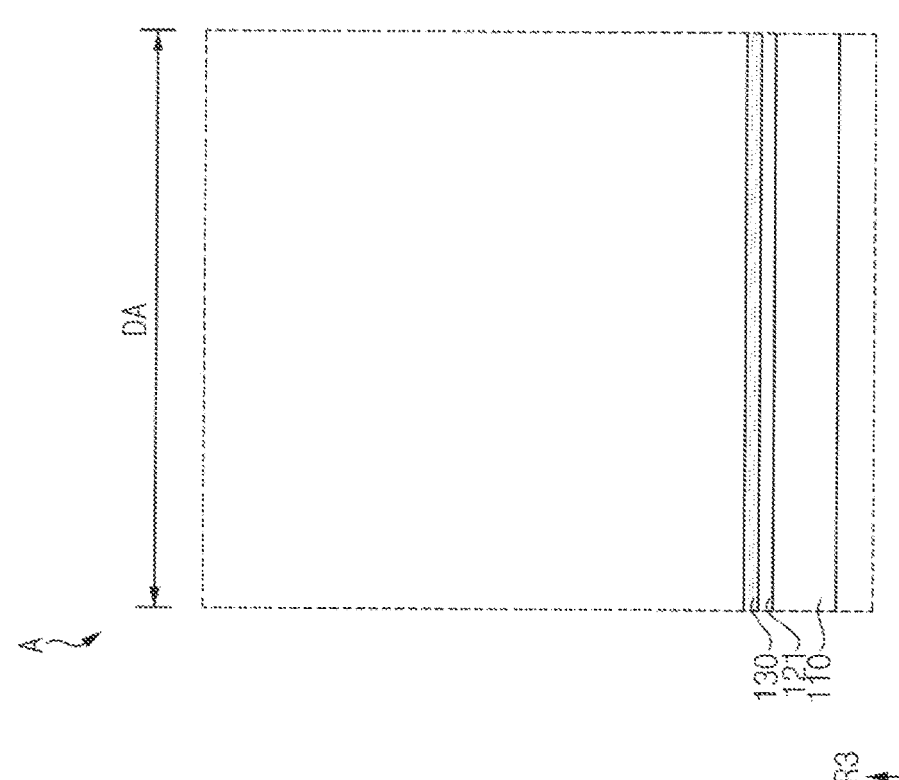
Figure 8:
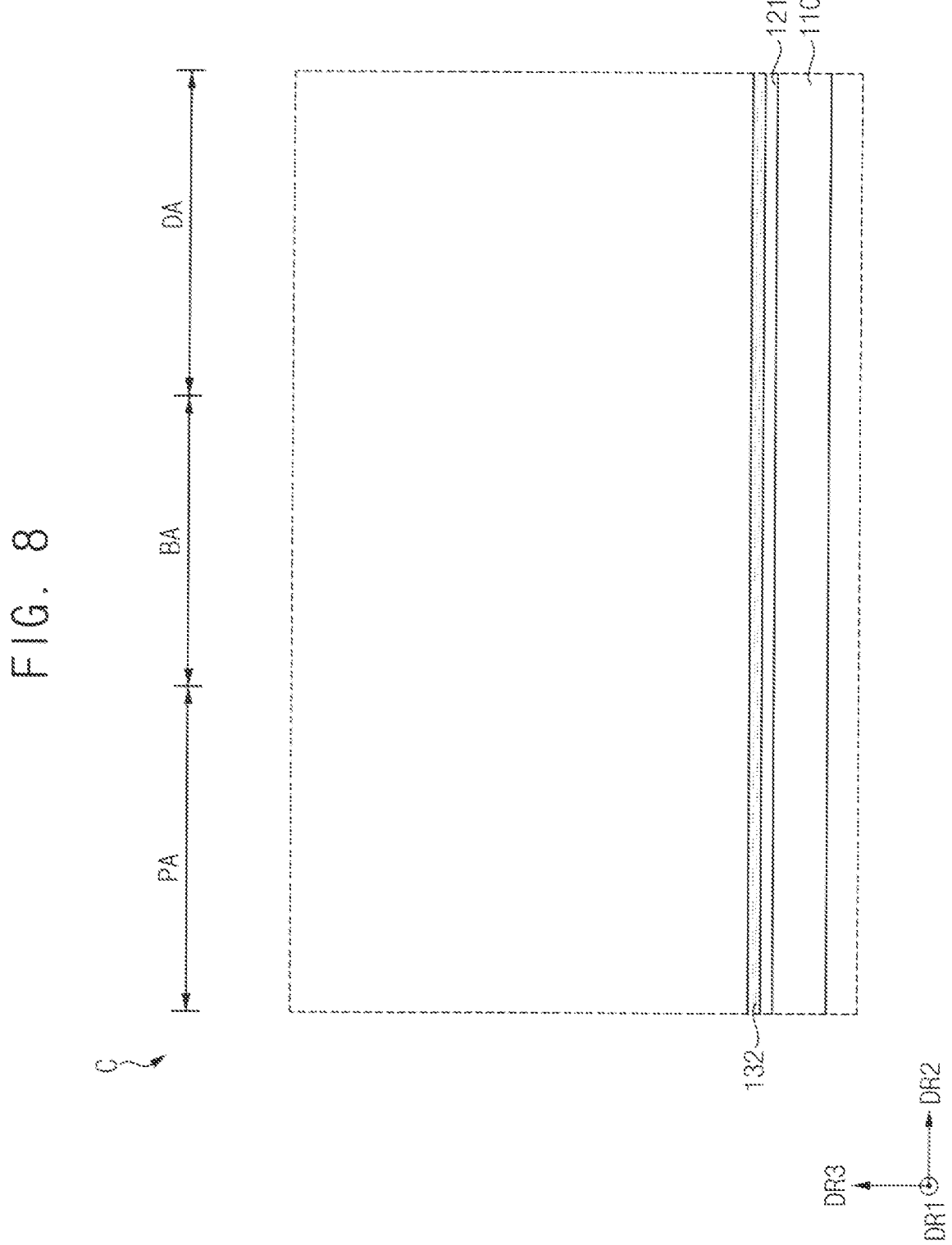

Referring to FIGS. 7 and 8, the substrate 110 may be disposed on a rigid glass substrate (not shown), such as a carrier substrate. After a semiconductor element, a display structure 300, a thin film encapsulation structure 340, and the like are formed on the substrate 110, the rigid glass substrate may be removed. The substrate 110 may be formed of (or include) a transparent resin substrate. Examples of the transparent resin substrate include a polyimide substrate.

The first barrier layer 121 may be formed (or provided) in the display area DA, the bending area BA, and the pad area PA, on the substrate 110. For example, the first barrier layer 121 may be formed using a silicon compound, a metal oxide, and the like.

The lower metal layer 130 may be formed in the display area DA, on the first barrier layer 121. For example, the lower metal layer 130 may be formed using a metal, a metal alloy, a metal nitride, a conductive metal oxide, a transparent conductive material, and the like.

The heat dissipation layer 131 may be formed in the pad area PA, on the first barrier layer 121, and the transmission line 132 may be formed in the bending area BA, on the first barrier layer 121. The transmission line 132 may extend to a portion of the display area DA and a portion of the pad area PA. The heat dissipation layer 131 and the transmission line 132 may be simultaneously formed using the same material as the lower metal layer 130. That is, the heat dissipation layer 131 and the transmission line 132 may be formed in the same process as the lower metal layer 130, may be respective patterns of a same material layer (e.g., a first material layer), etc.

Figure 9:
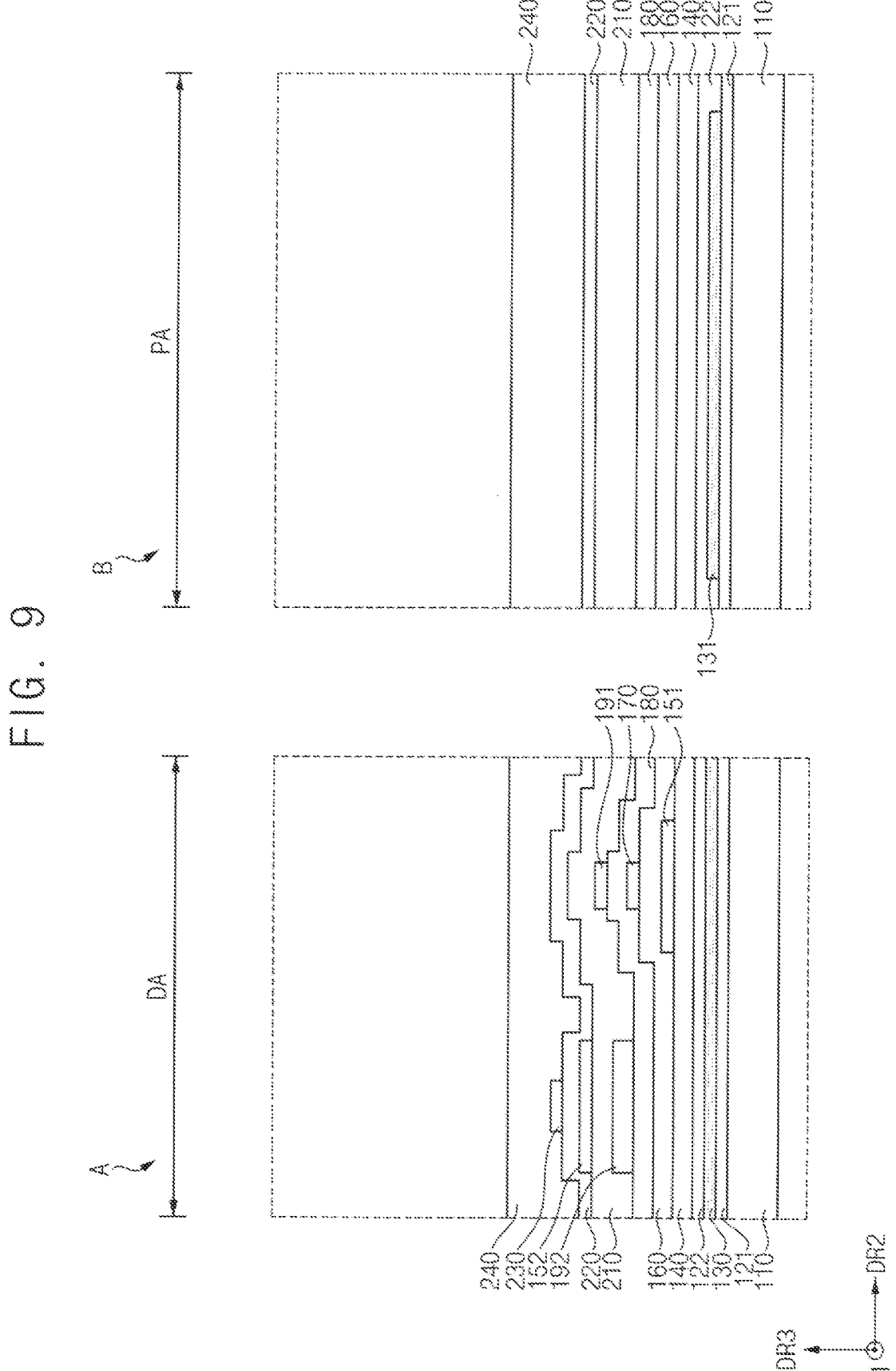
Figure 10:
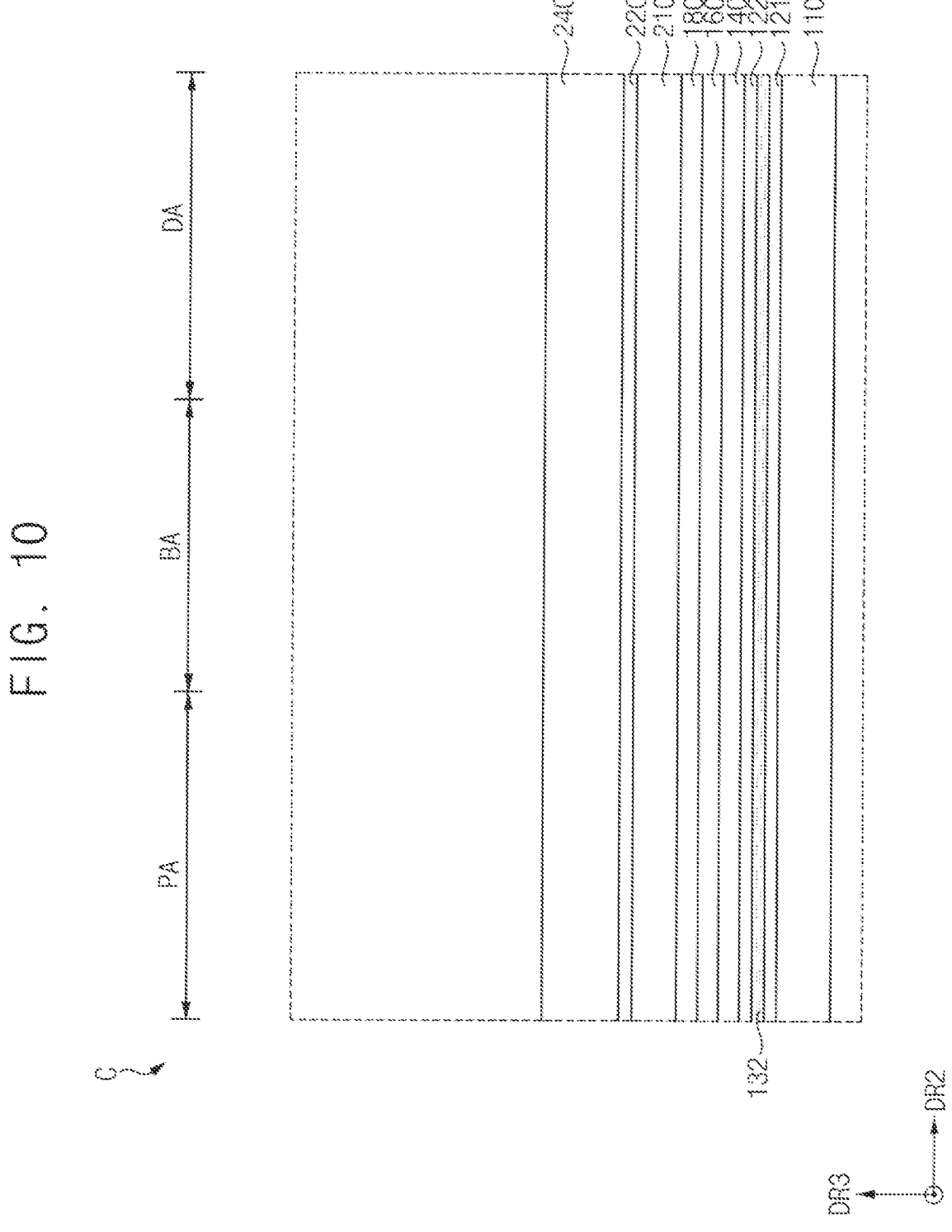

Referring to FIGS. 9 and 10, the second barrier layer 122 may be formed in the display area DA, on the lower metal layer 130. In addition, the second barrier layer 122 may be formed in the bending area BA and the pad area PA, on the heat dissipation layer 131 and the transmission line 132. For example, the second barrier layer 122 may be formed using a silicon compound, a metal oxide, and the like.

The buffer layer 140 may be formed in the display area DA, the bending area BA, and the pad area PA, on the second barrier layer 122. For example, the buffer layer 140 may be formed using an inorganic insulating material.

The first active layer 151 may be formed in the display area DA, on the buffer layer 140. The first active layer 151 may be formed using a metal oxide semiconductor, an inorganic semiconductor, or an organic semiconductor. The first active layer 151 may include a first source region and a first drain region.

The first gate insulating layer 160 may be formed on the buffer layer 140. The first gate insulating layer 160 may cover the first active layer 151 in the display area DA and may extend to the bending area BA and the pad area PA. For example, the first gate insulating layer 160 may be formed using a silicon compound, a metal oxide, and the like.

The first gate electrode 170 may be formed in the display area DA, on the first gate insulating layer 160. The first gate electrode 170 may partially overlap the first active layer 151. For example, the first gate electrode 170 may be formed using a metal, a metal alloy, a metal nitride, a conductive metal oxide, a transparent conductive material, and the like.

The second gate insulating layer 180 may be formed on the first gate insulating layer 160. The second gate insulating layer 180 may cover the first gate electrode 170 in the display area DA and may extend to the bending area BA and the pad area PA. For example, the second gate insulating layer 180 may be formed using a silicon compound, a metal oxide, and the like.

The second gate electrode 191 may be formed in the display area DA, on the second gate insulating layer 180. The second gate electrode 191 may overlap the first gate electrode 170. For example, the second gate electrode 191 may be formed using a metal, a metal alloy, a metal nitride, a conductive metal oxide, a transparent conductive material, and the like.

The lower gate electrode 192 may be formed in the display area DA on the second gate insulating layer 180. The lower gate electrode 192 may not overlap the first active layer 151. The lower gate electrode 192 may be simultaneously formed using the same material as the second gate electrode 191. That is, the lower gate electrode 192 may be formed in the same process as the second gate electrode 191.

The first interlayer insulating layer 210 may be formed on the second gate insulating layer 180. The first interlayer insulating layer 210 may cover the second gate electrode 191 and the lower gate electrode 192 in the display area DA, and may extend to the bending area BA and the pad area PA. For example, the first interlayer insulating layer 210 may be formed using a silicon compound, a metal oxide, and the like.

The second active layer 152 may be disposed in the display area DA, on the first interlayer insulating layer 210. The second active layer 152 may overlap the lower gate electrode 192. The second active layer 152 may be formed using a metal oxide semiconductor. The second active layer 152 may include a second source region and a second drain region.

The third gate insulating layer 220 may be formed on the first interlayer insulating layer 210. The third gate insulating layer 220 may cover the second active layer 152 in the display area DA and may extend to the bending area BA and the pad area PA. For example, the third gate insulating layer 220 may be formed using a silicon compound, a metal oxide, and the like.

The third gate electrode 230 may be formed in the display area DA, on the third gate insulating layer 220. For example, the third gate electrode 230 may be formed using a metal, a metal alloy, a metal nitride, a conductive metal oxide, a transparent conductive material, and the like.

The second interlayer insulating layer 240 may be formed on the third gate insulating layer 220. The second interlayer insulating layer 240 may cover the third gate electrode 230 in the display area DA and may extend to the bending area BA and the pad area PA. For example, the second interlayer insulating layer 240 may be formed using a silicon compound, a metal oxide, and the like.

Figure 11:
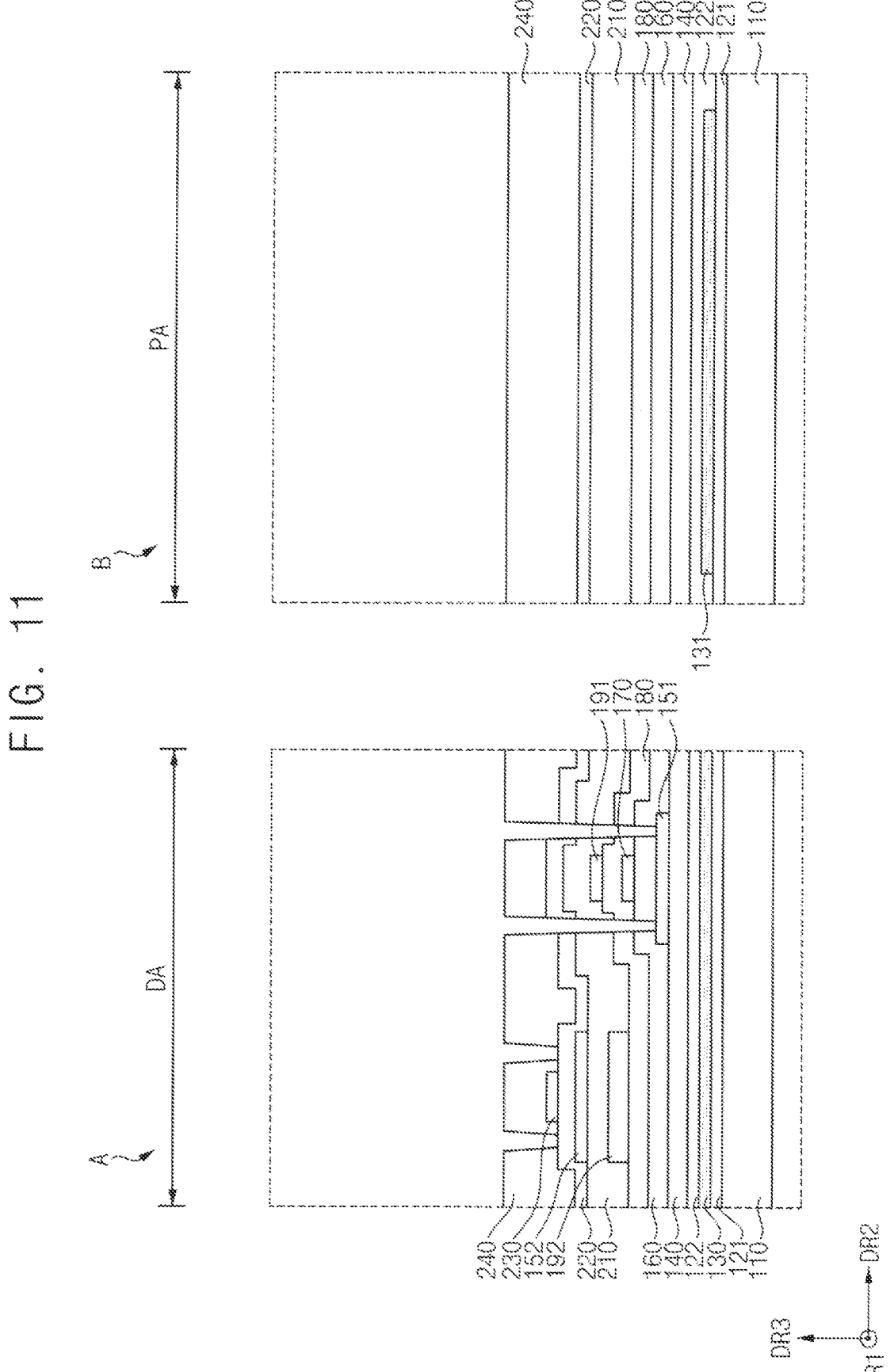
Figure 12:
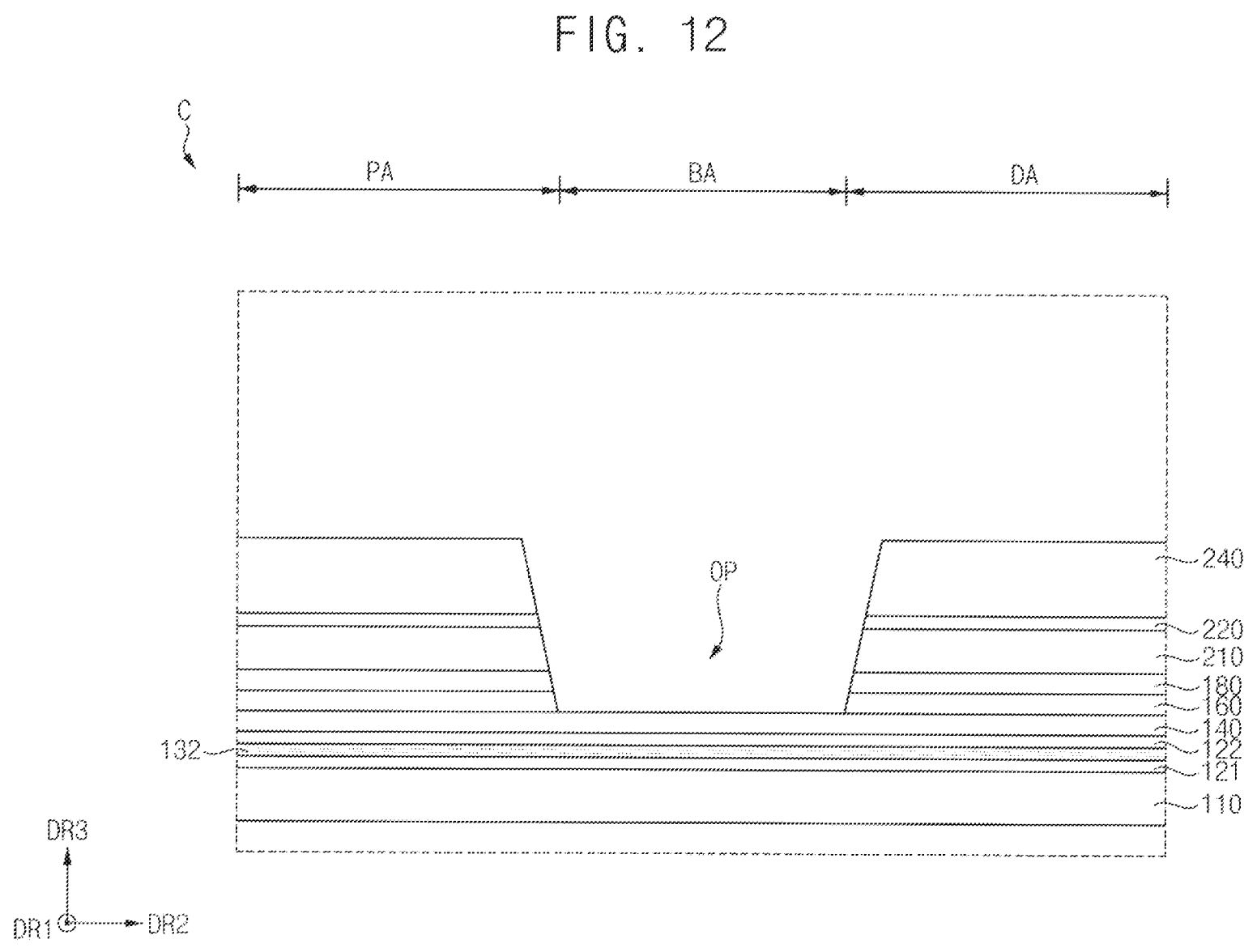

Referring to FIGS. 11 and 12, a first display area contact hole may formed by removing a first portion of the first gate insulating layer 160, the second gate insulating layer 180, the first interlayer insulating layer 210, the third gate insulating layer 220, and the second interlayer insulating layer 240 in the display area DA. A second display area contact hole may formed by removing a second portion of the first gate insulating layer 160, the second gate insulating layer 180, the first interlayer insulating layer 210, the third gate insulating layer 220, and the second interlayer insulating layer 240 in the display area DA. The first display area contact hole may expose the first source region of the first active layer 151, and the second display area contact hole may expose the first drain region of the first active layer 151, to outside the various insulating layers which together may be considered as defining an insulating layer.

A third display area contact hole may be formed by removing a third portion of the third gate insulating layer 220 and the second interlayer insulating layer 240 in the display area DA. A fourth display area contact hole may be formed by removing a fourth portion of the third gate insulating layer 220 and the second interlayer insulating layer 240. The third display area contact hole may expose the second source region of the second active layer 152, and the fourth display area contact hole may expose the second drain region of the second active layer 152. The first to fourth display area contact holes may be formed simultaneously.

An opening OP exposing the upper surface of the buffer layer 140 may be formed by removing the first gate insulating layer 160, the second gate insulating layer 180, the first interlayer insulating layer 210, the third gate insulating layer 220, and the second interlayer insulating layer 240 positioned in the bending area BA. The opening OP may be formed simultaneously with the first to fourth display area contact holes.

Figure 13:
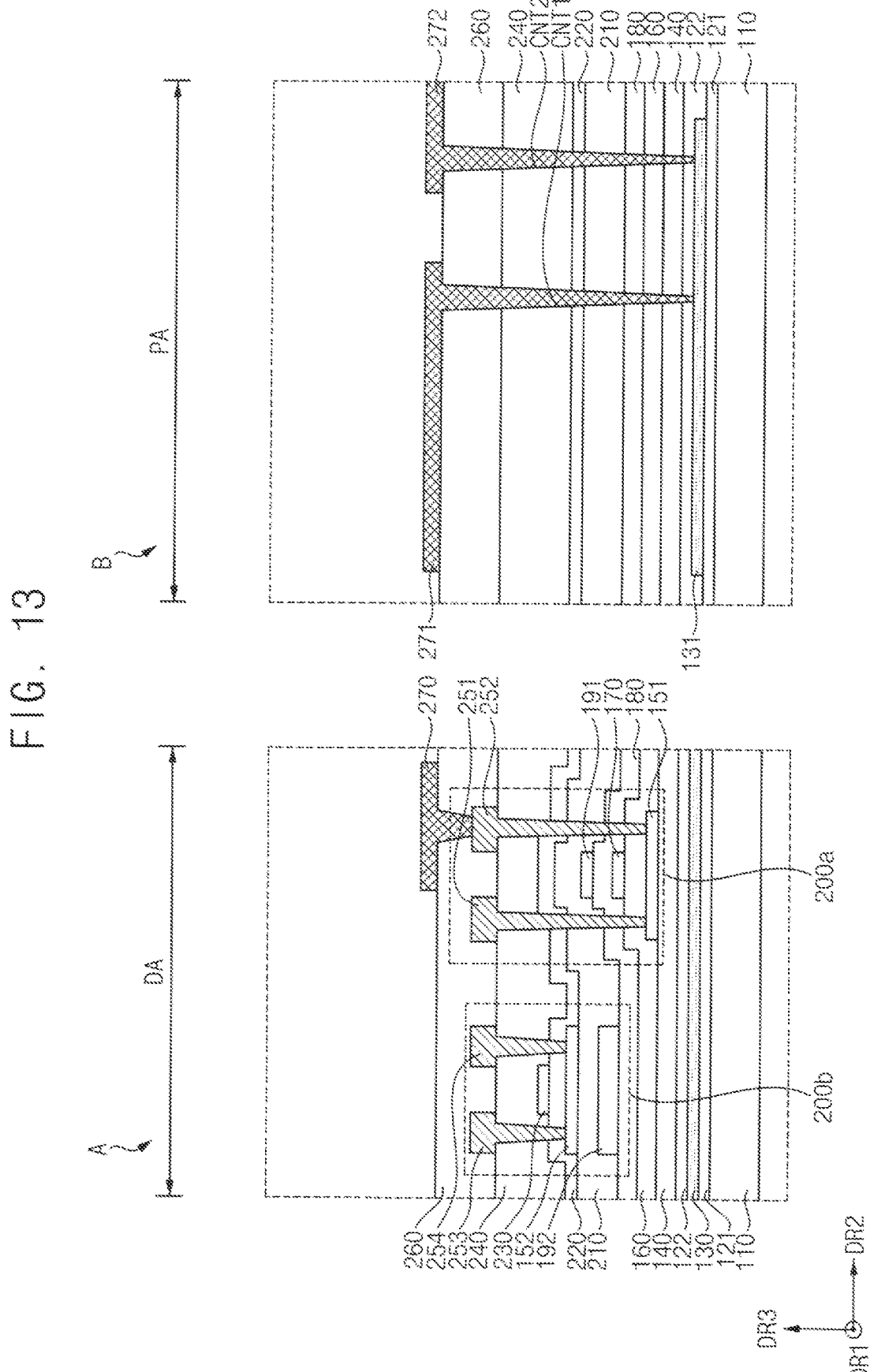
Figure 14:
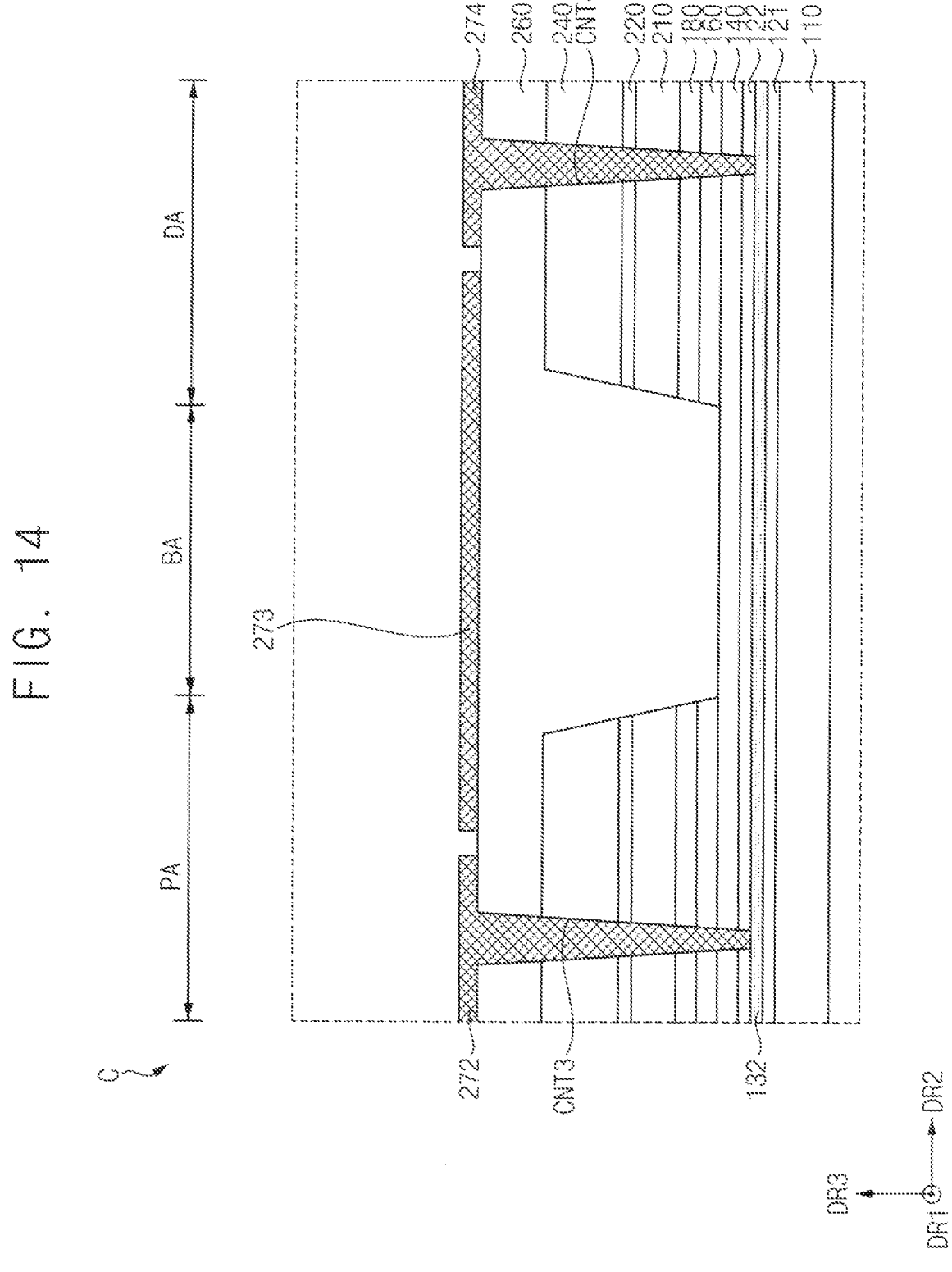

Referring to FIGS. 13 and 14, the first source electrode 251 and the first drain electrode 252 may be formed in the display area DA on the second interlayer insulating layer 240. The first source electrode 251 may fill the first display area contact hole and may be connected to the first source region of the first active layer 151, and the first drain electrode 252 may fill the second display area contact hole and may be connected to the first drain region of the first active layer 151.

The second source electrode 253 and the second drain electrode 254 may be formed in the display area DA on the second interlayer insulating layer 240. The second source electrode 253 may fill the third display area contact hole and may be connected to the second source region of the second active layer 152, and the second drain electrode 254 may fill the fourth display area contact hole and may be connected to the second drain region of the second active layer 152.

The first planarization layer 260 may be formed on the second interlayer insulating layer 240. The first planarization layer 260 may sufficiently cover the first source electrode 251, the first drain electrode 252, the second source electrode 253, and the second drain electrode 254 in the display area DA. In addition, the first planarization layer 260 may extend to the bending area BA and the pad area PA, and may fill the opening OP positioned in the bending area BA. For example, the first planarization layer 260 may be formed using an organic insulating material.

The connection pattern 270 may be formed in the display area DA, on the first planarization layer 260. The connection pattern 270 may be connected to the first drain electrode 252 through a display area contact hole formed by removing a portion of the first planarization layer 260. For example, the connection pattern 270 may be formed using a metal, a metal alloy, a metal nitride, a conductive metal oxide, a transparent conductive material, and the like.

The input line 271 may be formed in the pad area PA, on the first planarization layer 260. The input line 271 may be connected to the heat dissipation layer 131 through a first contact hole CNT1 (e.g., a pad area contact hole) formed by removing a portion of the first gate insulating layer 160, the second gate insulating layer 180, the first interlayer insulating layer 210, the third gate insulating layer 220, the second interlayer insulating layer 240, and the first planarization layer 260. The input line 271 may be simultaneously formed using the same material as the connection pattern 270.

The first output line 272 may be formed in the pad area PA, on the first planarization layer 260. The first output line 272 may be connected to the heat dissipation layer 131 through a second contact hole CNT2 formed by removing a portion of the first gate insulating layer 160, the second gate insulating layer 180, the first interlayer insulating layer 210, the third gate insulating layer 220, the second interlayer insulating layer 240, and the first planarization layer 260. In addition, the first output line 272 may be connected to the transmission line 132 through a third contact hole CNT3 formed by removing a portion of the first gate insulating layer 160, the second gate insulating layer 180, the first interlayer insulating layer 210, the third gate insulating layer 220, the second interlayer insulating layer 240, and the first planarization layer 260. The first output line 272 may be simultaneously formed using the same material as the connection pattern 270.

The second output line 274 may be formed in the display area DA, on the first planarization layer 260. The second output line 274 may be connected to the transmission line 132 through a fourth contact hole CNT4 formed by removing a portion of the first gate insulating layer 160, the second gate insulating layer 180, the first interlayer insulating layer 210, the third gate insulating layer 220, the second interlayer insulating layer 240, and the first planarization layer 260.

The shielding layer 273 may be formed in the bending area BA, on the first planarization layer 260. The shielding layer 273 may extend to a portion of the display area DA and a portion of the pad area PA. The shielding layer 273 may be simultaneously formed using the same material as the connection pattern 270.

Figure 15:
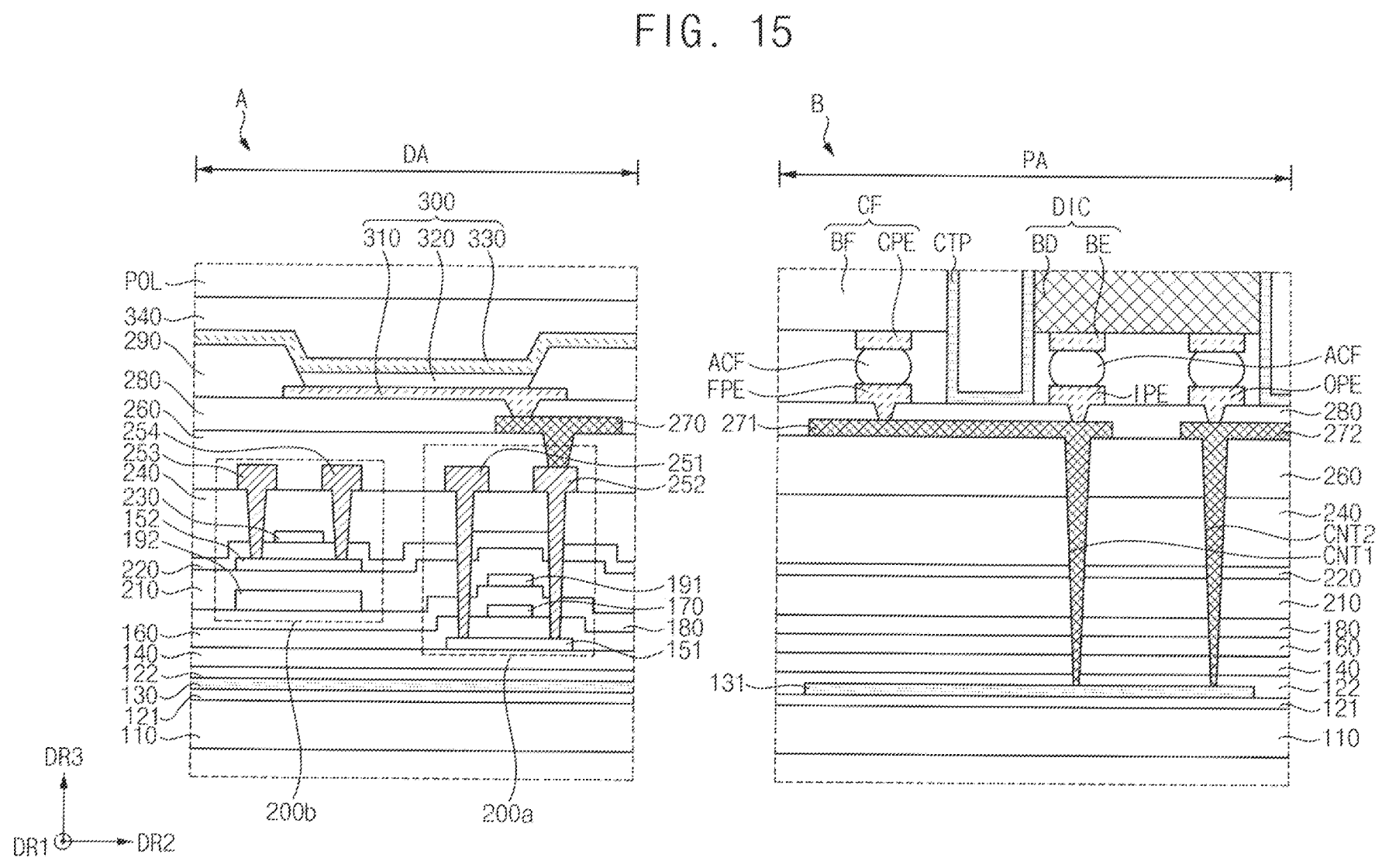
Figure 16:
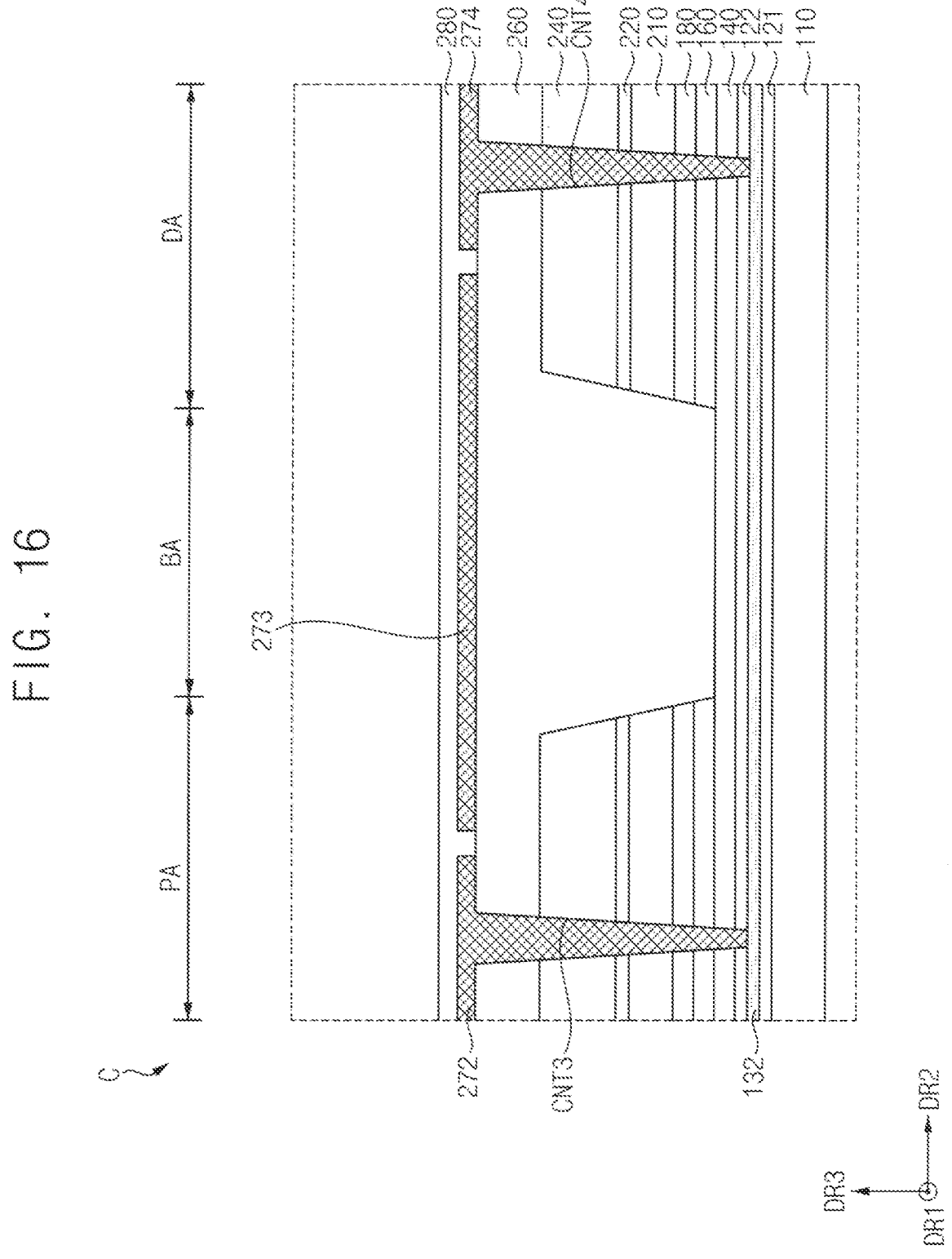

Referring to FIGS. 15 and 16, the second planarization layer 280 may be formed in the display area DA, the bending area BA, and the pad area PA, on the first planarization layer 260. The second planarization layer 280 may sufficiently cover the connection pattern 270, the input line 271, the first output line 272, the shielding layer 273, and the second output line 274. For example, the second planarization layer 280 may be formed using an organic insulating material.

The lower electrode 310 may be formed in the display area DA, on the second planarization layer 280. For example, the lower electrode 310 may be formed using a metal, a metal alloy, a metal nitride, a conductive metal oxide, a transparent conductive material, and the like.

The pixel defining layer 290 may be formed in the display area DA, on the second planarization layer 280. The pixel defining layer 290 may expose a top surface of the lower electrode 310. For example, the pixel defining layer 290 may be formed using an organic insulating material.

The emission layer 320 may be formed on the lower electrode 310. Specifically, the emission layer 320 may be formed on the upper surface of the lower electrode 310 exposed by the pixel defining layer 290. The emission layer 320 may be formed using at least one of light emitting materials capable of emitting light of different colors according to the type of sub-pixel.

The upper electrode 330 may be formed in the display area DA, on the pixel defining layer 290 and the emission layer 320. For example, the upper electrode 330 may be formed using a metal, a metal alloy, a metal nitride, a conductive metal oxide, a transparent conductive material, and the like.

The thin film encapsulation structure 340 may be formed in the display area DA on the upper electrode 330. For example, the thin film encapsulation structure 340 may include at least one organic encapsulation layer and at least one inorganic encapsulation layer.

The film pad electrode FPE, the input pad electrode IPE, and the output pad electrode OPE may be formed in the pad area PA, on the second planarization layer 280. Each of the film pad electrode FPE and the input pad electrode IPE may be connected to the input line 271 through a contact hole formed by removing a portion of the second planarization layer 280. In addition, the output pad electrode OPE may be connected to the first output line 272 through a contact hole formed by removing a portion of the second planarization layer 280. For example, the film pad electrode FPE, the input pad electrode IPE, and the output pad electrode OPE may be formed using a metal, a metal alloy, a metal nitride, a conductive metal oxide, a transparent conductive material, and the like.

Accordingly, the display panel DP illustrated in FIGS. 3 to 6 may be manufactured, with the display panel DP having a pad electrode layer thereon. Referring to the display stacked structure in FIGS. 15 and 16, the display panel DP may be considered as including layers 110 through a pad electrode layer (e.g., the film pad electrode FPE, the input pad electrode IPE, and the output pad electrode OPE together), without being limited thereto.

Figure 17:
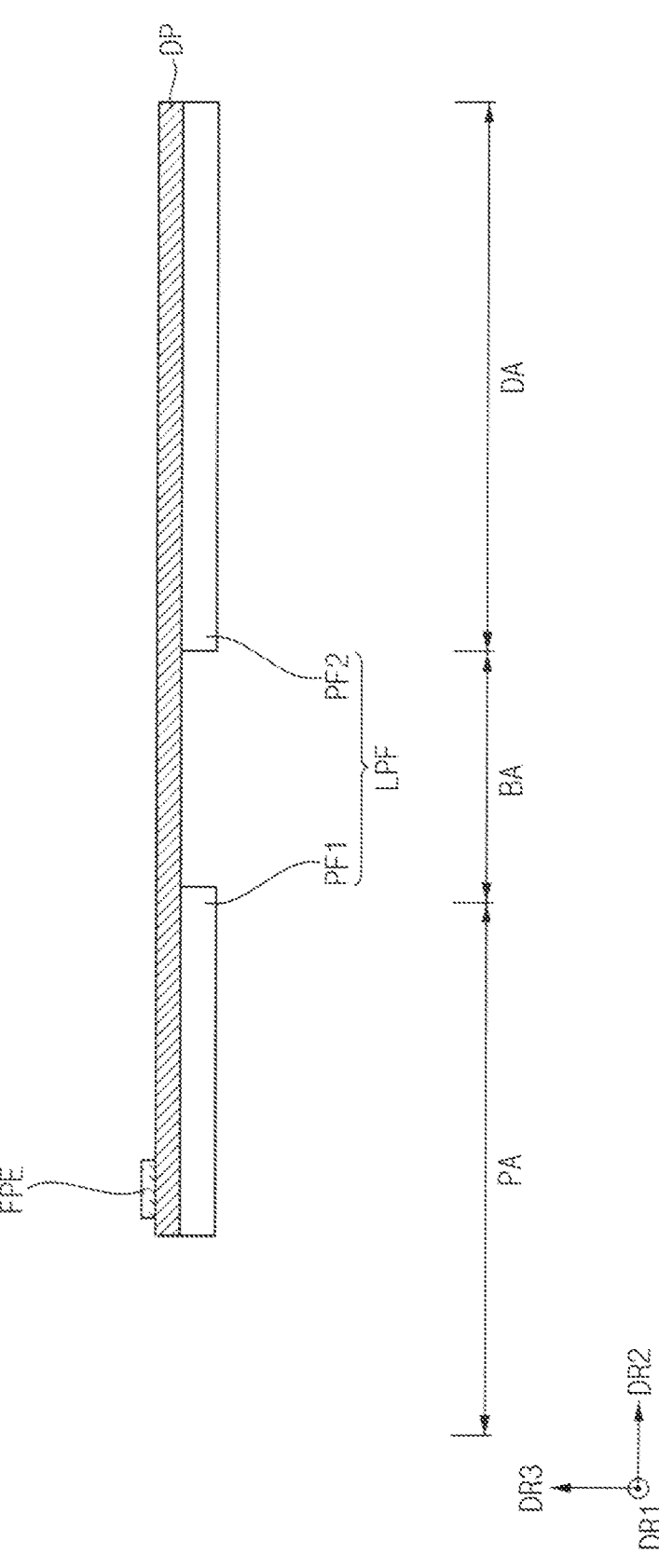

Referring to FIG. 17, the lower protective film LPF may be formed on the lower surface of the display panel DP. For example, the second protective film PF2 may be formed in the display area DA, on the lower surface of the display panel DP, and the first protective film PF1 may be formed in the pad area PA, on the lower surface of the display panel DP. The lower protective film LPF may be formed using an organic insulating material.

Figure 18:
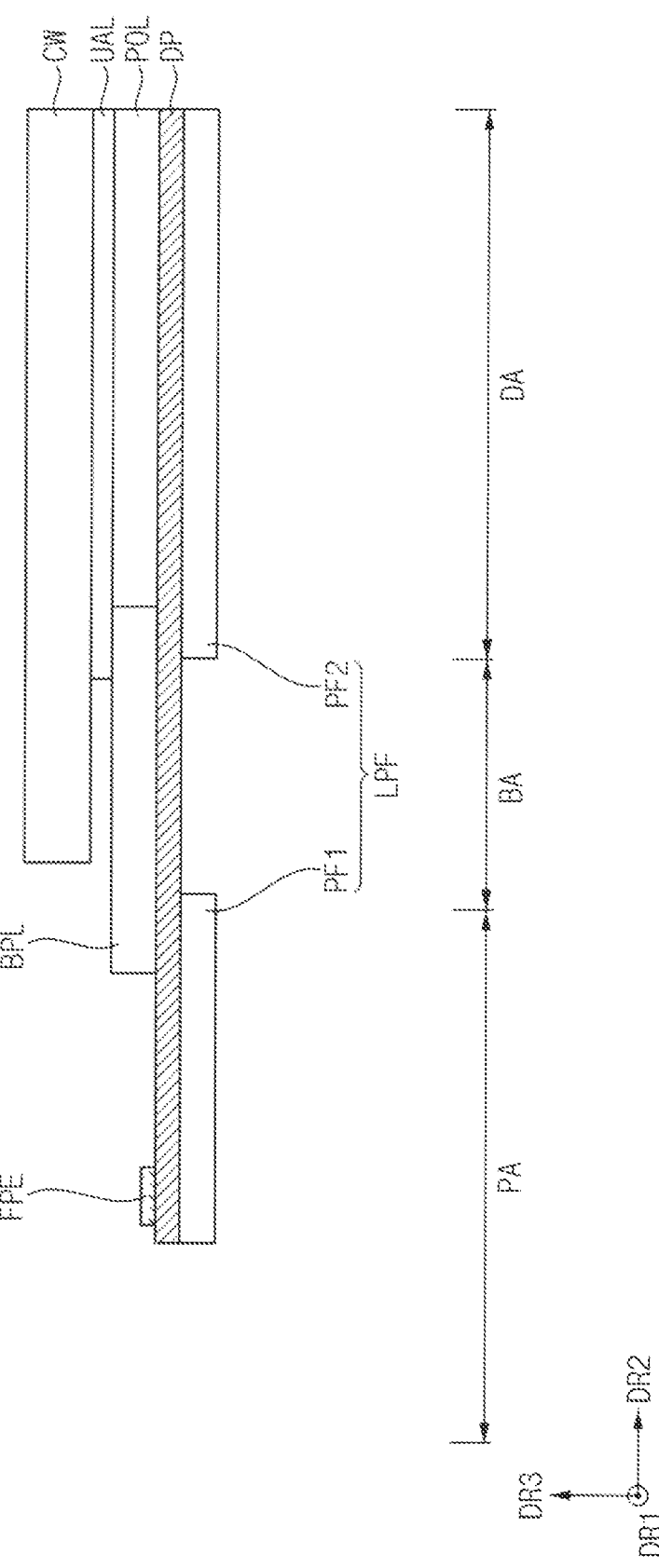

Referring to FIG. 18, the polarizing member POL may be formed in the display area DA, on the display panel DP having the pad electrode layer. The bending protective layer BPL may be formed in the bending area BA, on the display panel DP. The bending protective layer BPL may extend to a portion of the display area DA and a portion of the pad area PA. For example, the bending protective layer BPL may be formed using a photocurable resin or a thermosetting resin.

The upper adhesive layer UAL may be formed on the bending protective layer BPL and the polarizing member POL. For example, the upper adhesive layer UAL may be formed using OCA, PSA, OCR, and the like.

The cover window CW may be formed on the upper adhesive layer UAL. For example, the cover window CW may be formed using tempered glass, reinforced plastic, or the like.

Figure 19:
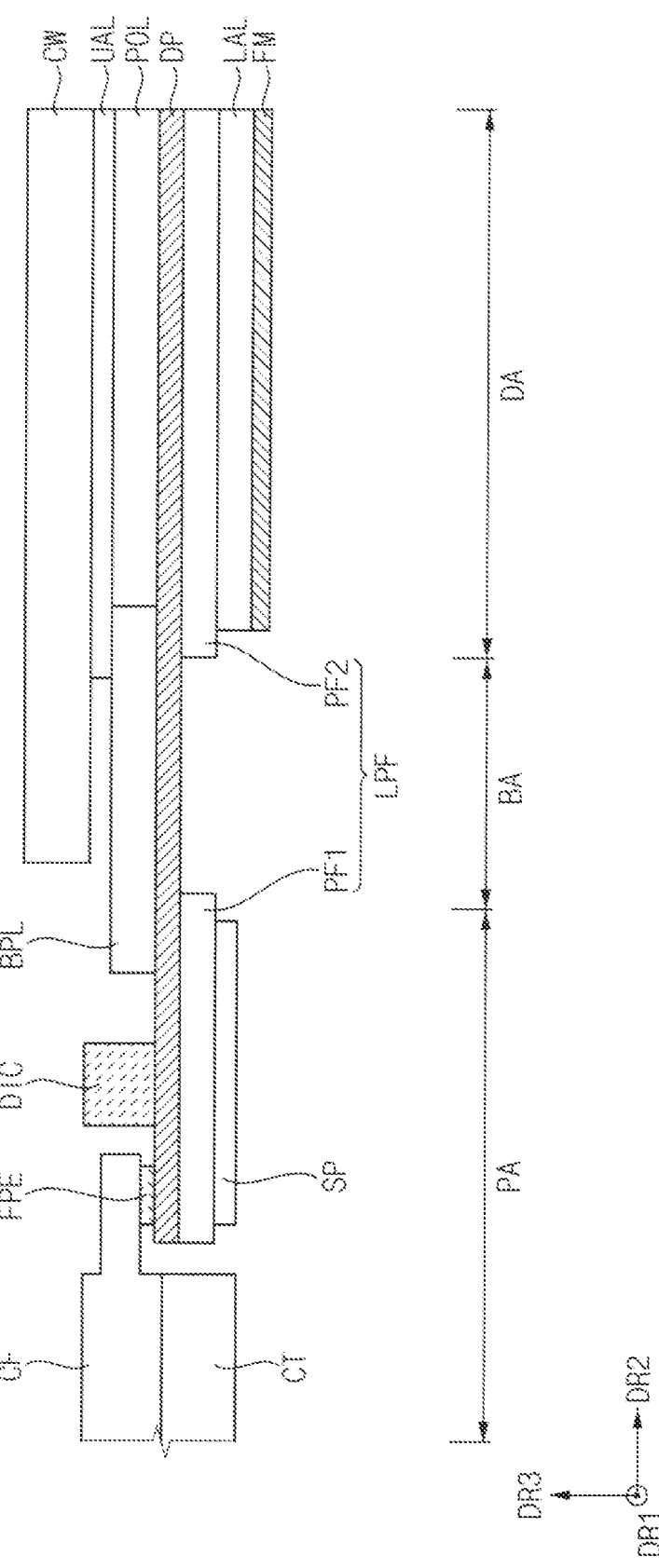

Referring to FIGS. 5 and 19, the driving integrated circuit DIC may be formed (or provided) in the pad area PA, on the display panel DP. The driving integrated circuit DIC may be connected to the display panel DP, at the pad area PA thereof. Specifically, the driving integrated circuit DIC may be connected to the display panel DP by the input pad electrode IPE and the output pad electrode OPE of the pad electrode layer. The bump electrodes BE of the driving integrated circuit DIC may be respectively attached to the input pad electrode IPE and the output pad electrode OPE, through the anisotropic conductive film ACF.

The connection film CF may be formed in the pad area PA, on the display panel DP having the pad electrode layer. Specifically, the connection film CF may be connected to the display panel DP at the pad area PA, by the film pad electrode FPE. The connection pad electrode CPE of the connection film CF may be attached to the display panel DP, by the film pad electrode FPE, through the anisotropic conductive film ACF.

The conductive tape CT may be formed on the lower surface of the connection film CF. For example, the conductive tape CT may be formed using an anisotropic conductive film or the like.

The lower adhesive layer LAL may be formed on the lower surface of the second protective film PF2. For example, the lower adhesive layer LAL may be formed using OCA, PSA, OCR, and the like.

The spacer SP may be formed on the lower surface of the first protective film PF1. For example, the spacer SP may be formed using an organic insulating material.

The functional member FM may be formed on the lower surface of the lower adhesive layer LAL. For example, the functional member FM may include a digitizer, a heat sink, or the like.

Referring back to FIGS. 3 and 4, various layers and components of the display panel DP which overlap the bending area BA may be bendable to be bent. The cover tape CTP may be formed in the pad area PA, on the driving integrated circuit DIC. In addition, the cover tape CTP may be formed on a portion of the bending protective layer BPL and a portion of the connection film CF. Alternatively, the cover tape CTP may be formed before the display panel DP is bent.

Accordingly, the display device 100 illustrated in FIGS. 3 and 4 may be manufactured or provided.

In the method of manufacturing (or providing) the display device 100 according to the embodiment of the invention, by forming the heat dissipation layer 131 and the transmission line 132 simultaneously with the lower metal layer 130 without an additional process, the manufacturing cost of the display device 100 may be relatively reduced.

The invention can be applied to various display devices. For example, the invention is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display panel comprising:
    a substrate comprising a display area, a pad area at which a driving integrated circuit is connected to the display panel, and a bending area between the display area and the pad area;
    a first material layer which is on the substrate and defines each of:
        a lower metal layer in the display area; and
        a heat dissipation layer in the pad area and overlapping the driving integrated circuit; and
    a semiconductor element in the display area, on the lower metal layer;
    inorganic insulating layers having an opening overlapping the bending area; and
    a shielding layer overlapping the opening in the bending area.

2. The display panel of claim 1, wherein the lower metal layer includes molybdenum.

3. The display panel of claim 1, further comprising:
    a display structure in the display area, on the semiconductor element; and
    a connection pattern in the display area and electrically connecting the semiconductor element and the display structure to each other.

4. The display panel of claim 3, further comprising a second material layer which is on the substrate, is different from the first material layer and defines each of:
    the connection pattern;

an input line in the pad area and corresponding to the heat dissipation layer; and a first output line in the pad area and corresponding to the heat dissipation layer.

5. The display panel of claim 4, further comprising:

an inorganic insulating layer in the display area, and between the lower metal layer and the connection pattern along a thickness direction of the display panel, the inorganic insulating layer extending from the display area to the pad area; and an organic insulating layer in the display area, and between the inorganic insulating layer and the connection pattern along the thickness direction of the display panel, the organic insulating layer extending from the display area to the bending area and the pad area.

6. The display panel of claim 5, wherein within the pad area, a first contact hole and a second contact hole are defined respectively extended through both the inorganic insulating layer and the organic insulating layer, the input line is connected to the heat dissipation layer at the first contact hole, and the first output line is connected to the heat dissipation layer at the second contact hole.

7. The display panel of claim 5, further comprising:

the second material layer further defining a second output line in the display area and connected to the display structure, and the first material layer further defining a transmission line in the bending area.

8. The display panel of claim 7, wherein the transmission line extends from the bending area to the display area and the pad area.

9. The display panel of claim 8, wherein a third contact hole in the pad area and a fourth contact hole in the display area are defined respectively extended through both the inorganic insulating layer and the organic insulating layer, the first output line is connected to the transmission line at the third contact hole in the pad area, and the second output line is connected to the transmission line at the fourth contact hole in the display area.

10. The display panel of claim 3, further comprising a second material layer which is on the substrate, is different from the first material layer and defines each of the shielding layer in the bending area and the connection pattern.

11. The display panel of claim 10, wherein the shielding layer extends from the bending area to the display area and the pad area.

12. The display panel of claim 1, wherein the semiconductor element includes an inorganic semiconductor or an organic semiconductor.

13. A display device comprising:

a display panel including:

a display area, a pad area, and a bending area between the display area and the pad area;

a first material layer defining each of:

a lower metal layer in the display area; and a heat dissipation layer in the pad area a semiconductor element in the display area, on the lower metal layer;

inorganic insulating layers having an opening overlapping the bending area; and a shielding layer overlapping the opening in the bending area;

and a driving integrated circuit connected to the display panel, at the pad area of the display panel, the driving integrated circuit overlapping the heat dissipation layer of the display panel.

14. The display device of claim 13, wherein the lower metal layer includes molybdenum.

15. The display device of claim 13, wherein the display panel further includes:

a display structure in the display area, on the semiconductor element; and a connection pattern in the display area and electrically connecting the semiconductor element and the display structure to each other.

16. The display device of claim 15, wherein the display panel further includes:

the first material layer further defining a transmission line in the bending area and the lower metal layer; and a second material layer which is different from the first material layer and defines each of:

the connection pattern;

an input line in the pad area and corresponding to the heat dissipation layer;

a first output line in the pad area and corresponding to the heat dissipation layer; and a second output line in the display area and corresponding to the transmission line.

17. The display device of claim 16, wherein the display panel further includes:

an inorganic insulating layer in the display area, and between the lower metal layer and the connection pattern along a thickness direction of the display panel, the inorganic insulating layer extending from the display area to the pad area; and an organic insulating layer in the display area, and between the inorganic insulating layer and the connection pattern along the thickness direction of the display panel, the organic insulating layer extending from the display area to the bending area and the pad area.

18. The display device of claim 17, wherein a first contact hole, a second contact hole and a third contact hole are defined in the pad area and respectively extended through both the inorganic insulating layer and the organic insulating layer, a fourth contact hole is defined in the display area and extended through both the inorganic insulating layer and the organic insulating layer, the input line is connected to the heat dissipation layer at the first contact hole, the first output line is connected to the heat dissipation layer at the second contact hole and to the transmission line at the third contact hole, and the second output line is connected to the transmission line at the fourth contact hole.

19. The display device of claim 15, wherein the display panel further includes a second material layer which is different from the first material layer and defines each of:

the shielding layer in the bending area, and extending from the bending area to the display area and the pad area, and the connection pattern.

20. The display device of claim 13, further comprising:

a connection film connected to the display panel, at the pad area; and a cover tape attached to the display panel, at the pad area, the cover tape covering the driving integrated circuit.

* * * * *